US008779809B2

(12) United States Patent
Murakami et al.

(10) Patent No.: US 8,779,809 B2
(45) Date of Patent: Jul. 15, 2014

(54) SIGNAL PROCESSING CIRCUIT, INVERTER CIRCUIT, BUFFER CIRCUIT, LEVEL SHIFTER, FLIP-FLOP, DRIVER CIRCUIT, AND DISPLAY DEVICE

(75) Inventors: Yuhichiroh Murakami, Osaka (JP); Yasushi Sasaki, Osaka (JP); Etsuo Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/819,400

(22) PCT Filed: Aug. 31, 2011

(86) PCT No.: PCT/JP2011/069822
§ 371 (c)(1),
(2), (4) Date: Feb. 27, 2013

(87) PCT Pub. No.: WO2012/029872
PCT Pub. Date: Mar. 8, 2012

(65) Prior Publication Data
US 2013/0154374 A1   Jun. 20, 2013

(30) Foreign Application Priority Data
Sep. 2, 2010   (JP) ................................ 2010-197204

(51) Int. Cl.
*H03K 3/00* (2006.01)
(52) U.S. Cl.
USPC .......................................... 327/112; 327/333
(58) Field of Classification Search
None
See application file for complete search history.

(56) References Cited

U.S. PATENT DOCUMENTS

| | | | |
|---|---|---|---|
| 8,390,560 B2 * | 3/2013 | Toyoshima et al. | ........... 345/100 |
| 8,427,206 B2 * | 4/2013 | Yamamoto et al. | ........... 327/108 |
| 2002/0167026 A1 | 11/2002 | Azami et al. | |
| 2008/0074164 A1 * | 3/2008 | Liu | ............................... 327/333 |
| 2008/0278650 A1 | 11/2008 | Kajiwara et al. | |
| 2009/0033377 A1 * | 2/2009 | Hashimoto et al. | ........... 327/112 |
| 2010/0244946 A1 | 9/2010 | Murakami et al. | |

FOREIGN PATENT DOCUMENTS

| | | | |
|---|---|---|---|
| JP | 61-005618 | A | 1/1986 |
| JP | 09-036729 | A | 2/1997 |
| JP | 2002-335153 | A | 11/2002 |
| JP | 2008-205767 | A | 9/2008 |
| JP | 2008-268261 | A | 11/2008 |
| JP | 2009-077208 | A | 4/2009 |
| JP | 2009-094927 | A | 4/2009 |
| JP | 2009-188749 | A | 8/2009 |
| WO | 2009/084272 | A1 | 7/2009 |

* cited by examiner

*Primary Examiner* — Cassandra Cox
(74) *Attorney, Agent, or Firm* — Keating & Bennett, LLP

(57) ABSTRACT

A signal processing circuit of the present invention includes: first and second input terminals; an output terminal; a bootstrap capacitor; a first output section connected to the second input terminal and the output terminal; a second output section connected to the first input terminal, a first power source, and the output terminal; and an electric charge control section for controlling the electric charge of the bootstrap capacitor, the electric charge control section being connected to the first input terminal, the electric charge control section and the first output section being connected to each other via a relay section for either electrically connecting the electric charge control section and the first output section to each other or electrically blocking the electric charge control section and the first output section from each other, the electric charge control section including a resistor connected to a second power source. This configuration can increase reliability of a bootstrap-type signal processing circuit.

15 Claims, 31 Drawing Sheets

F I G. 2
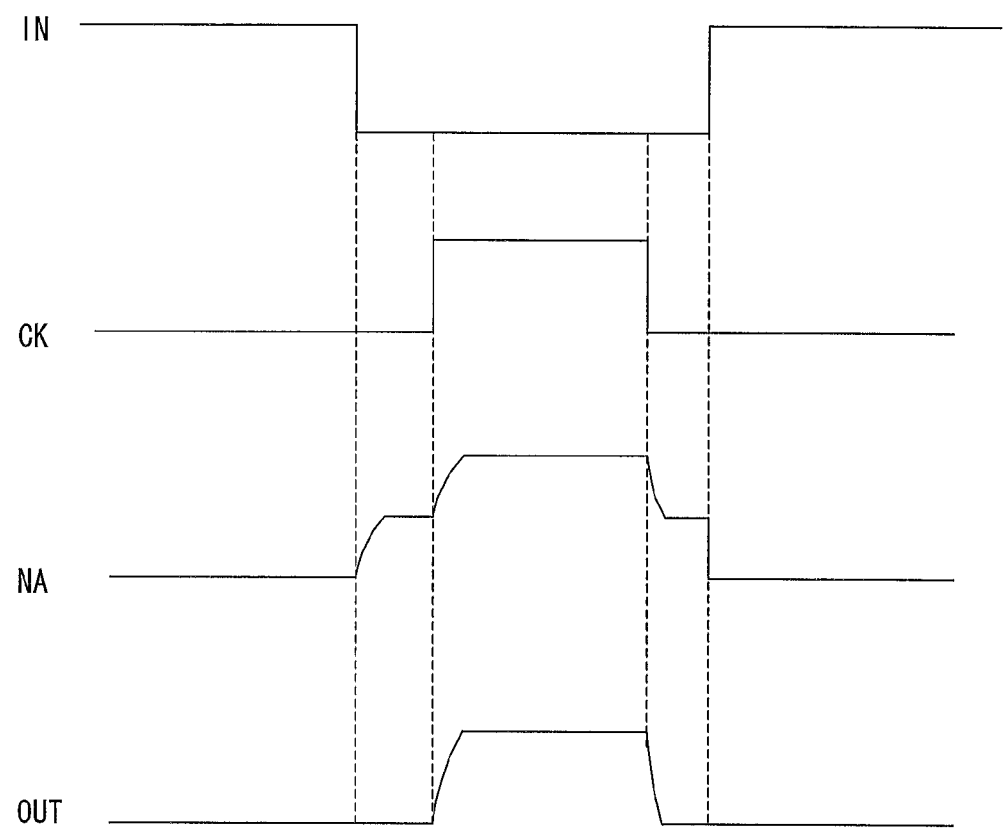

F I G. 4
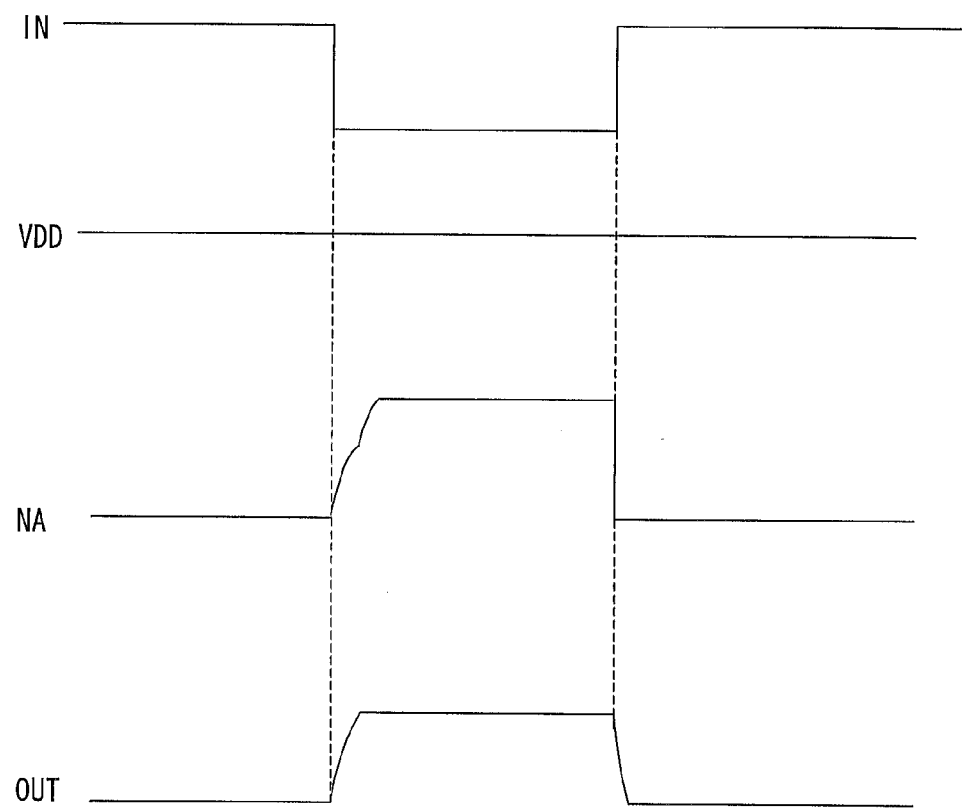

F I G. 5
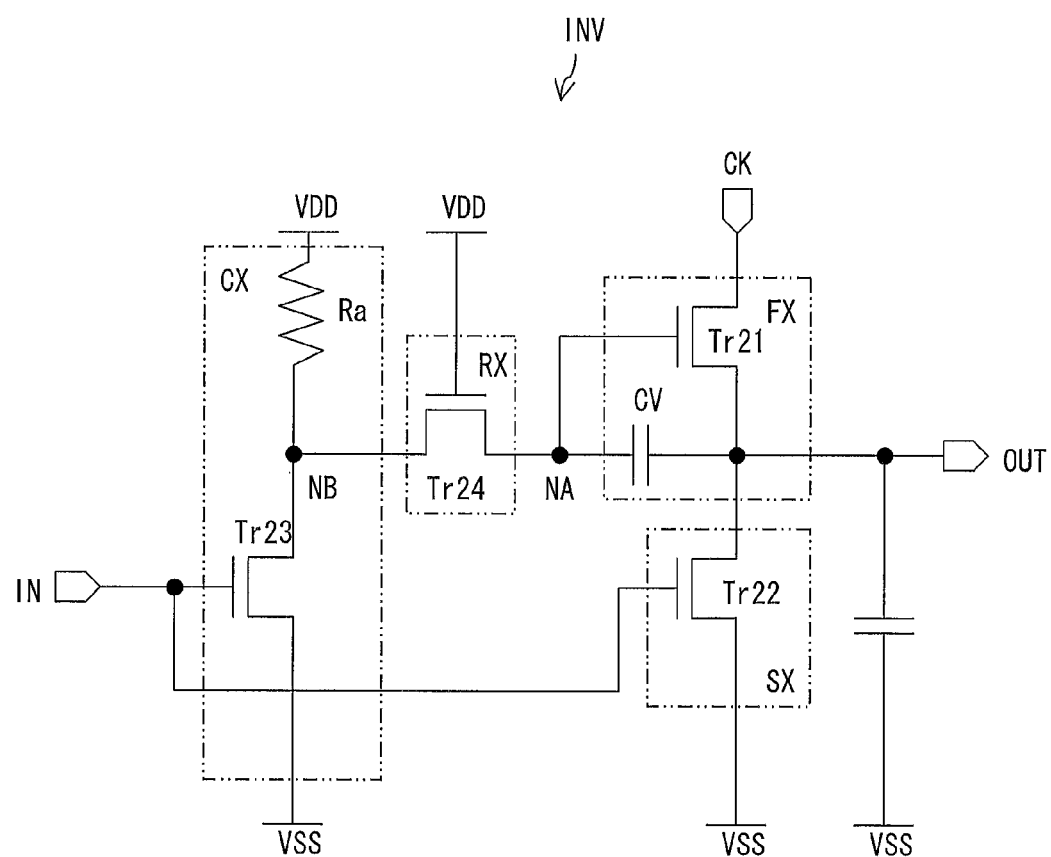

F I G. 6
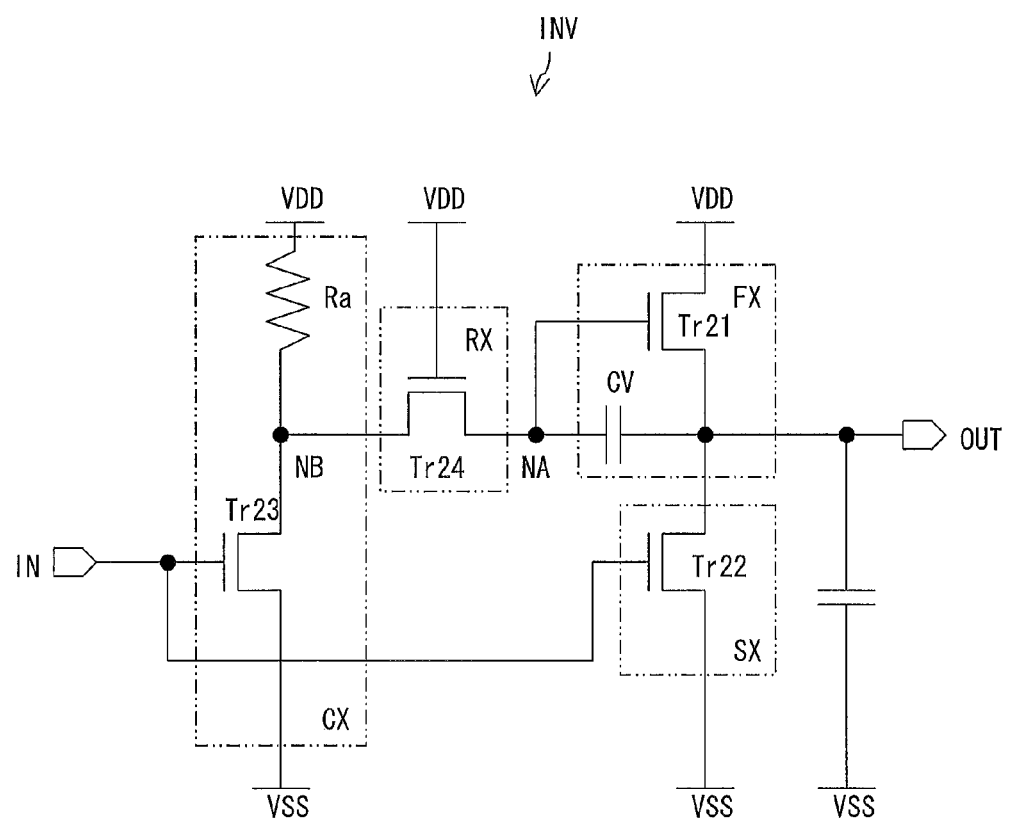

FIG. 7
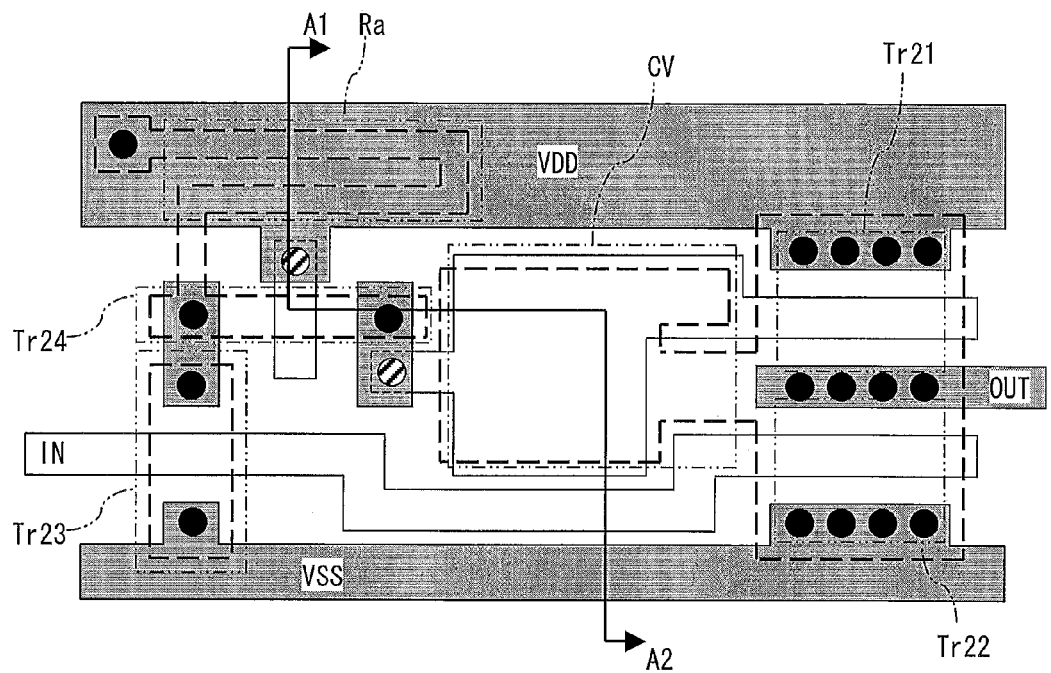
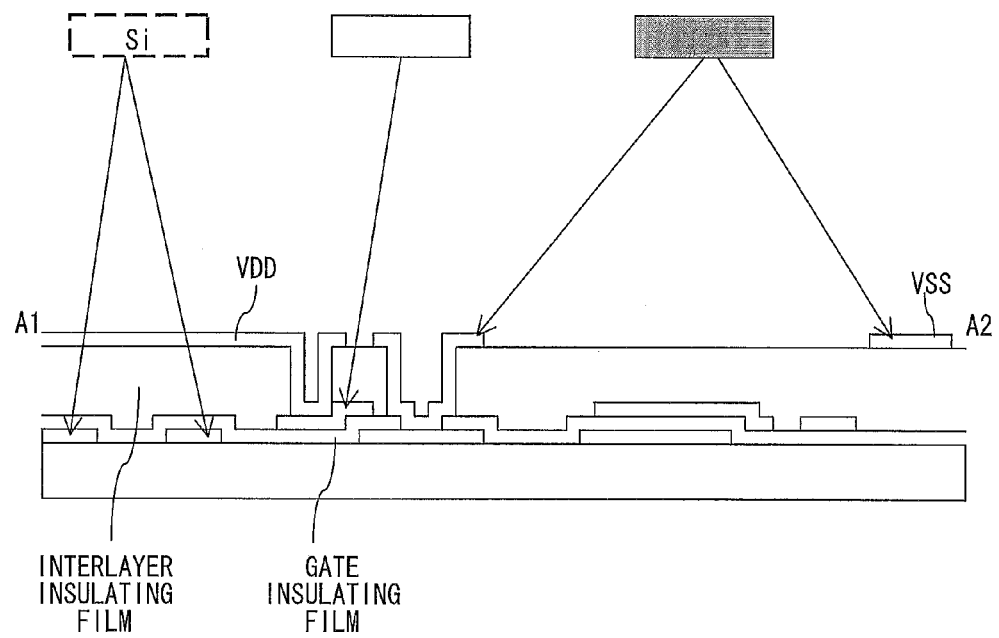

F I G. 8
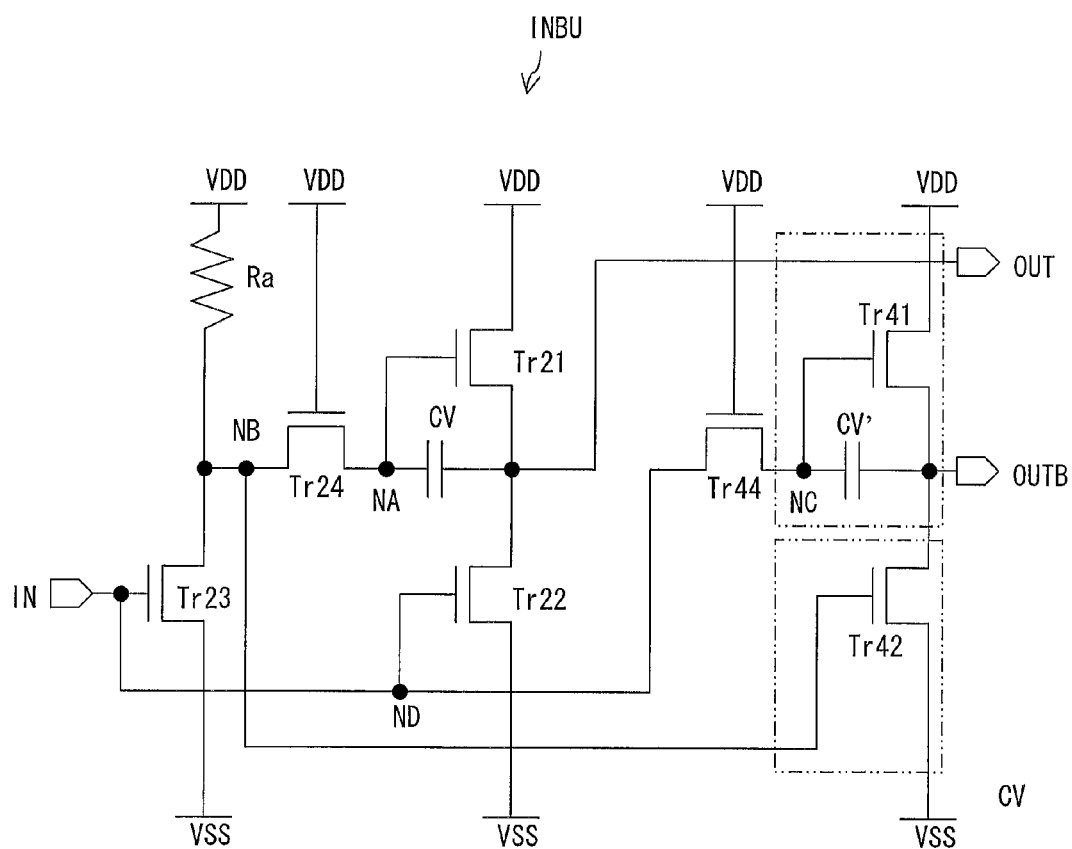

F I G. 9
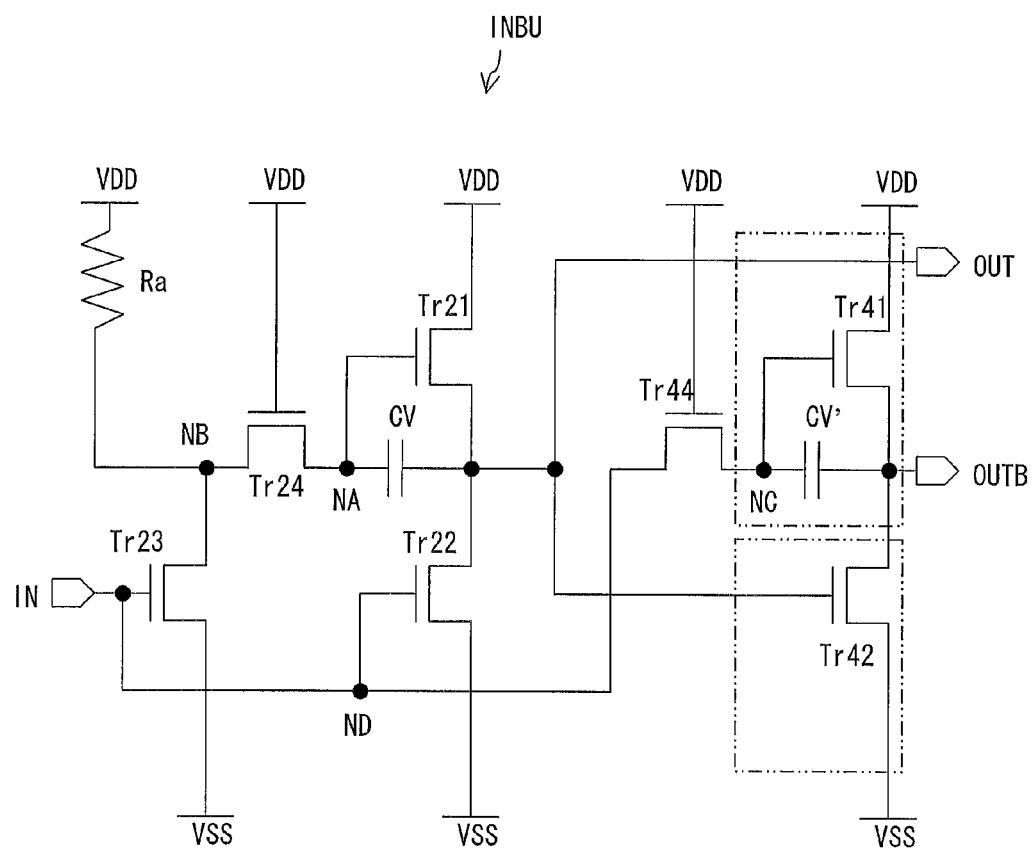

F I G. 1 3
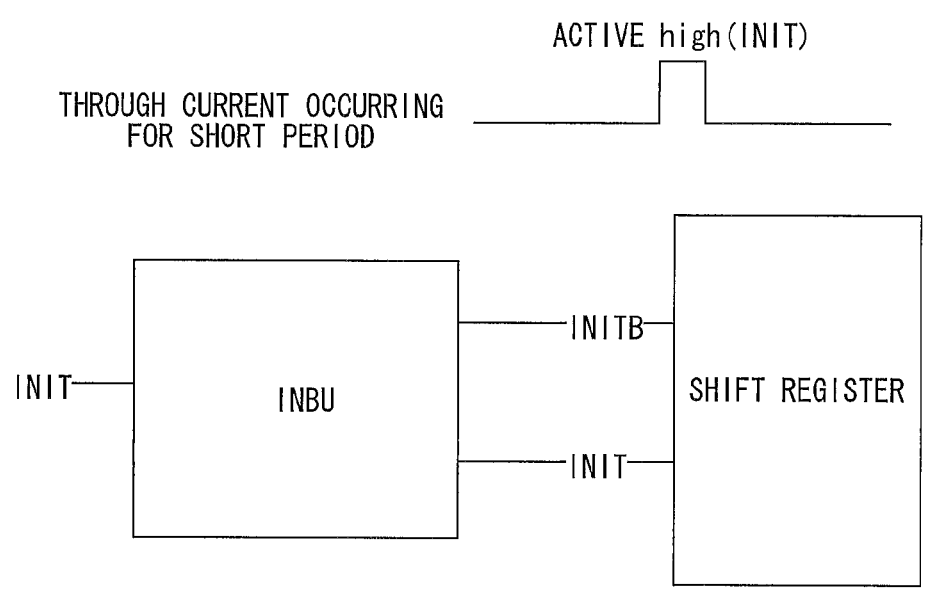

F I G. 1 4
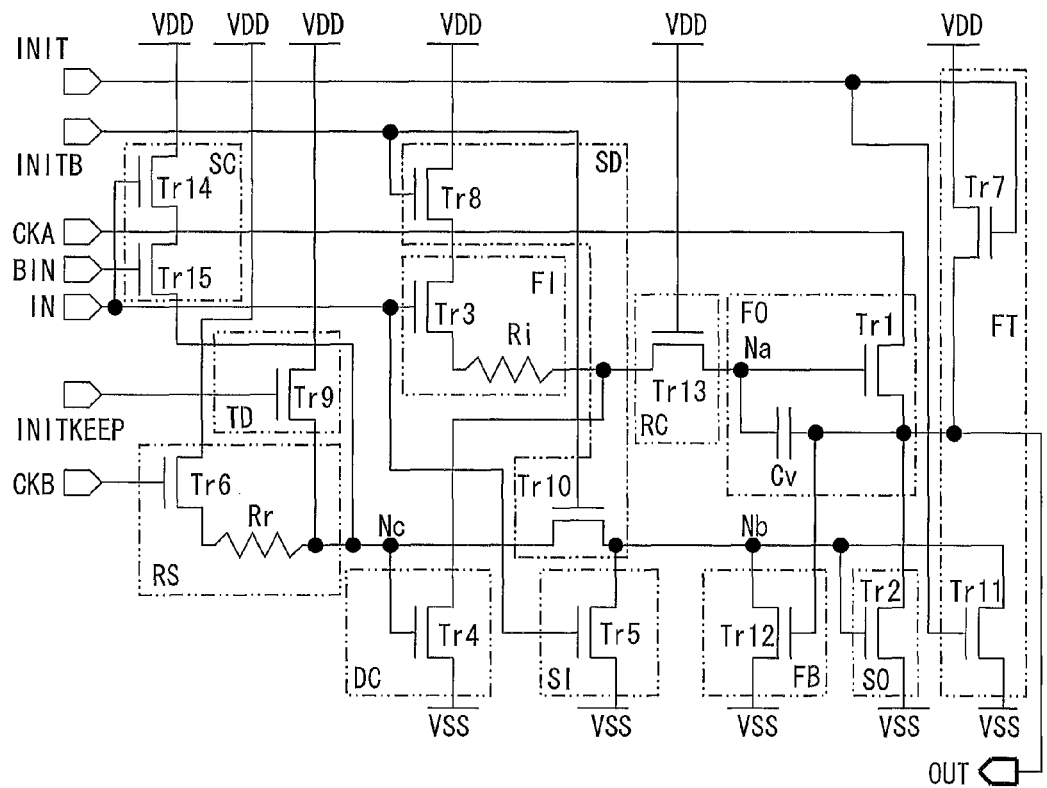

F I G. 1 5
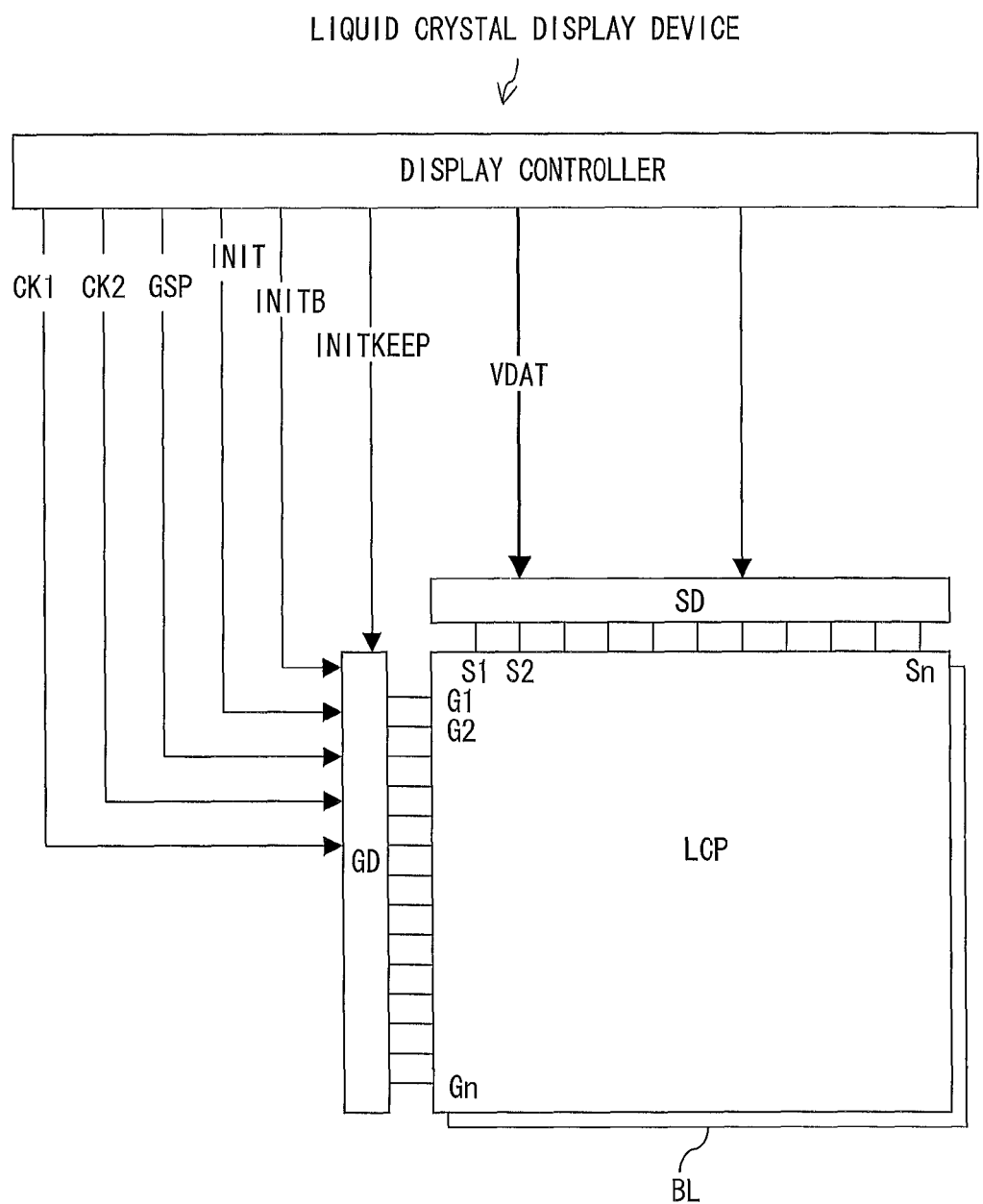

F I G. 1 7
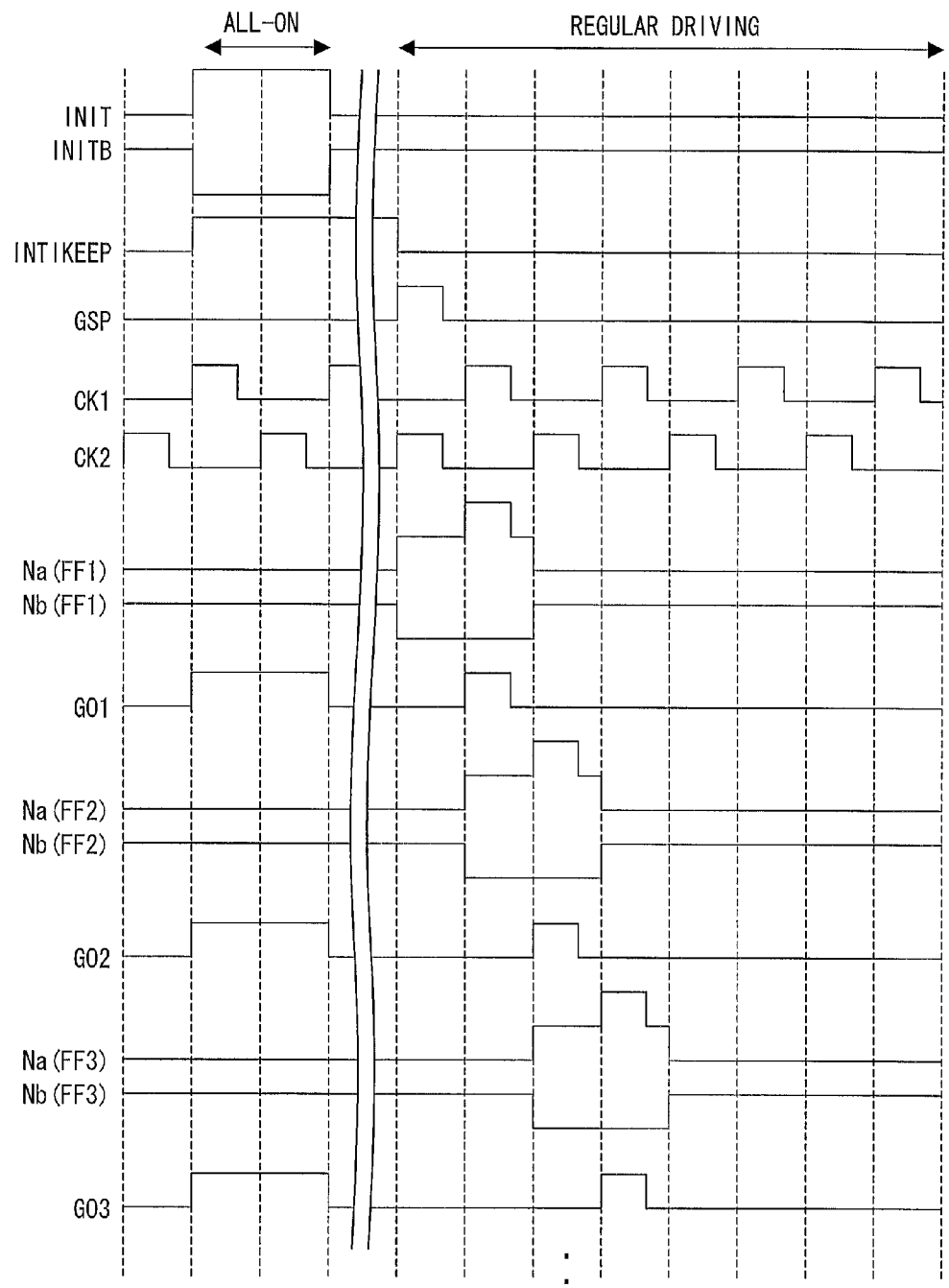

F I G. 1 8
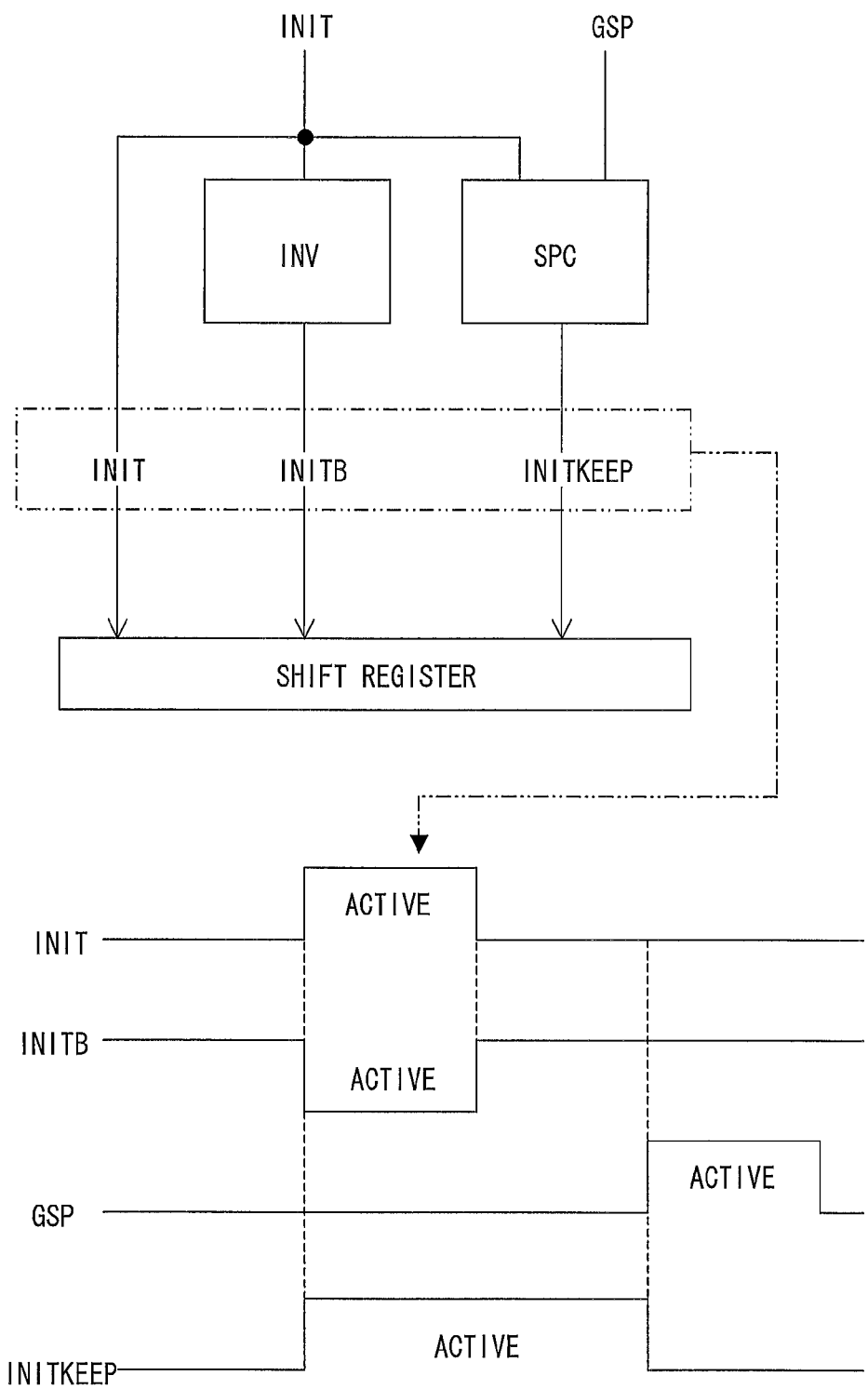

F I G. 2 3
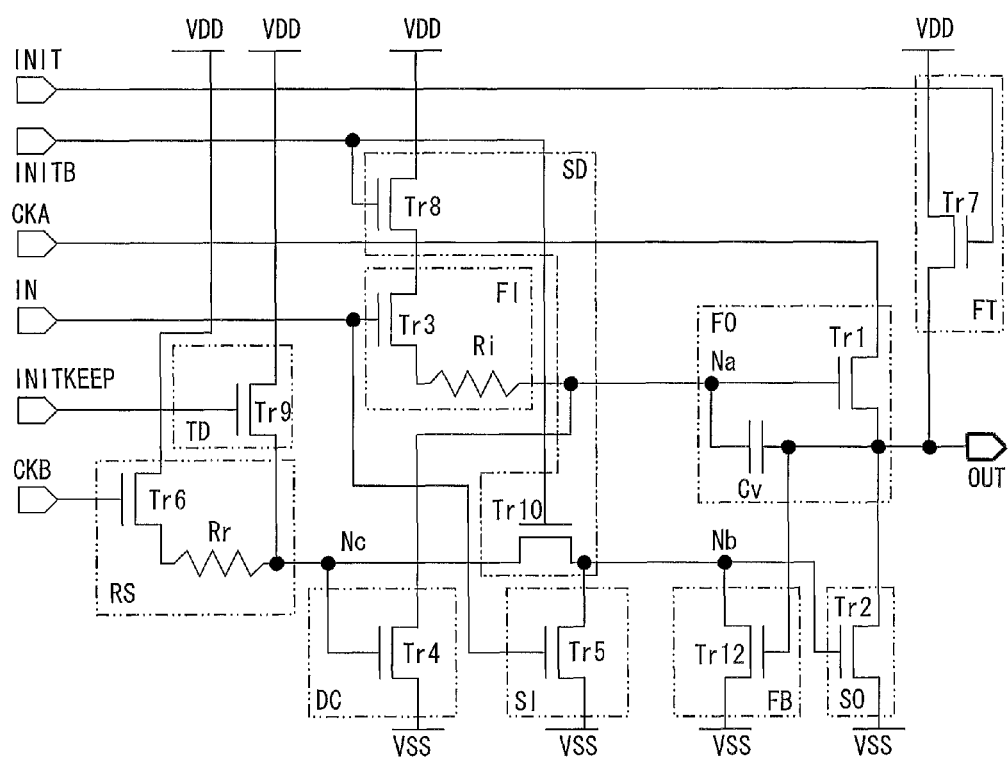

F I G. 2 4
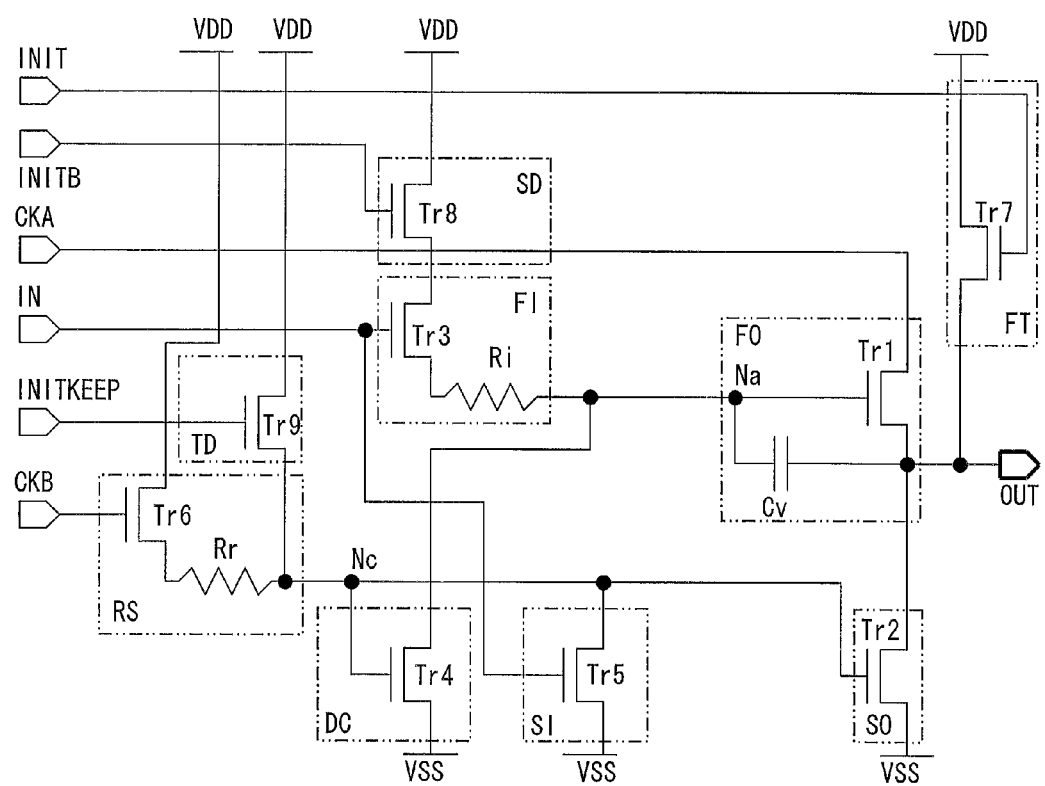

F I G. 2 6
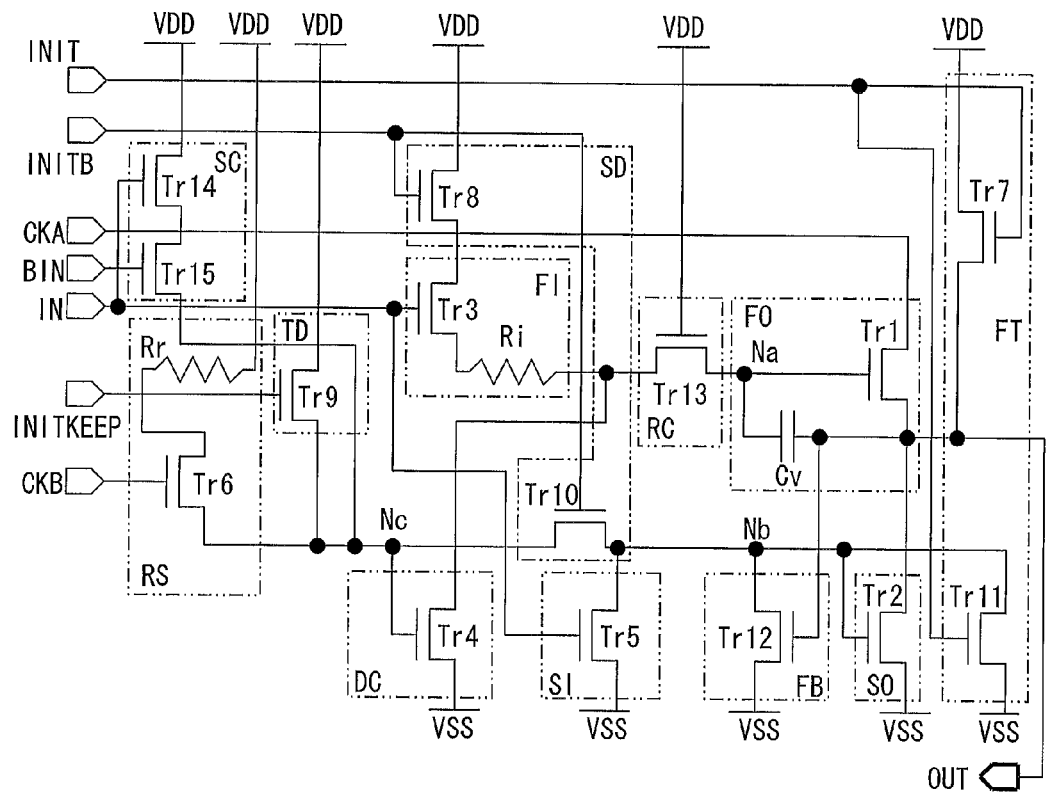

F I G. 2 7
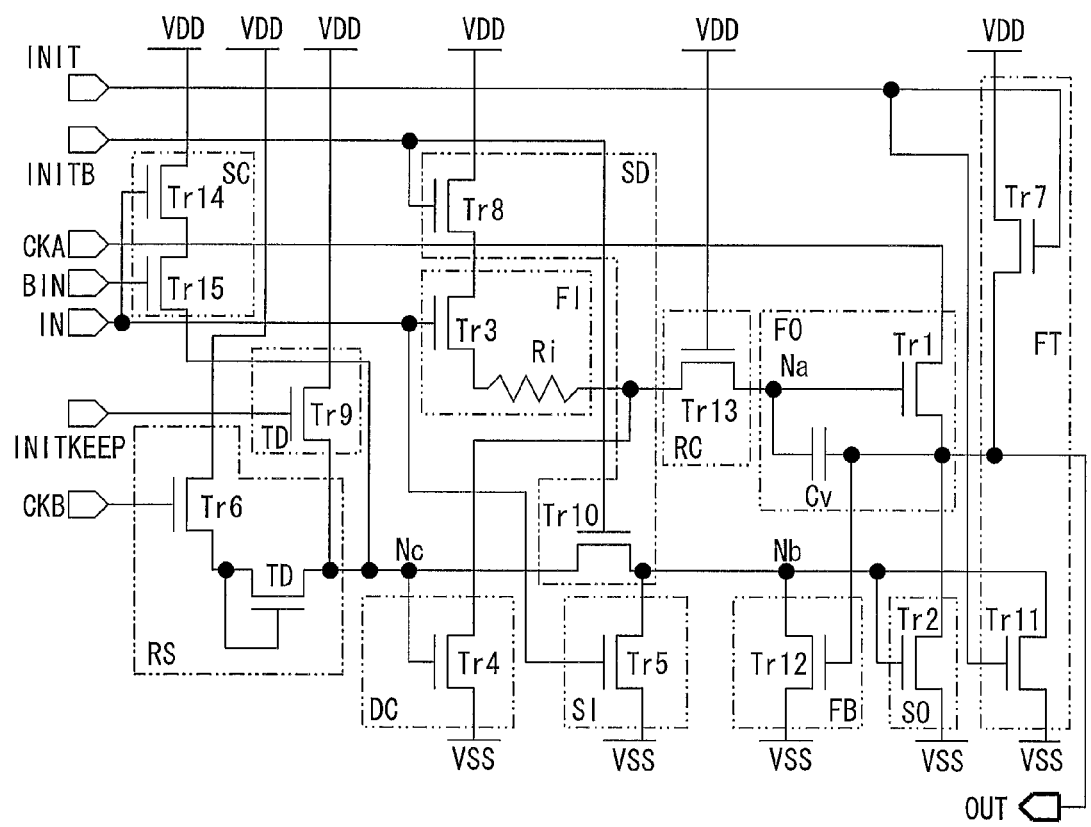

F I G. 2 8
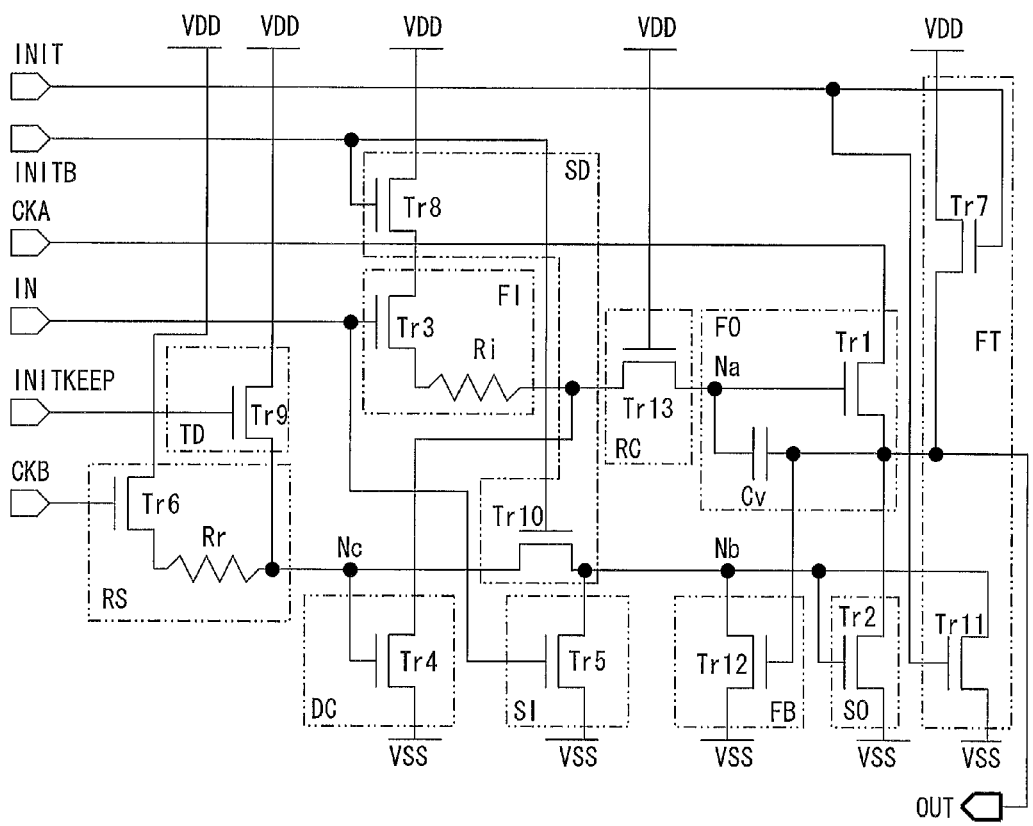

F I G. 2 9
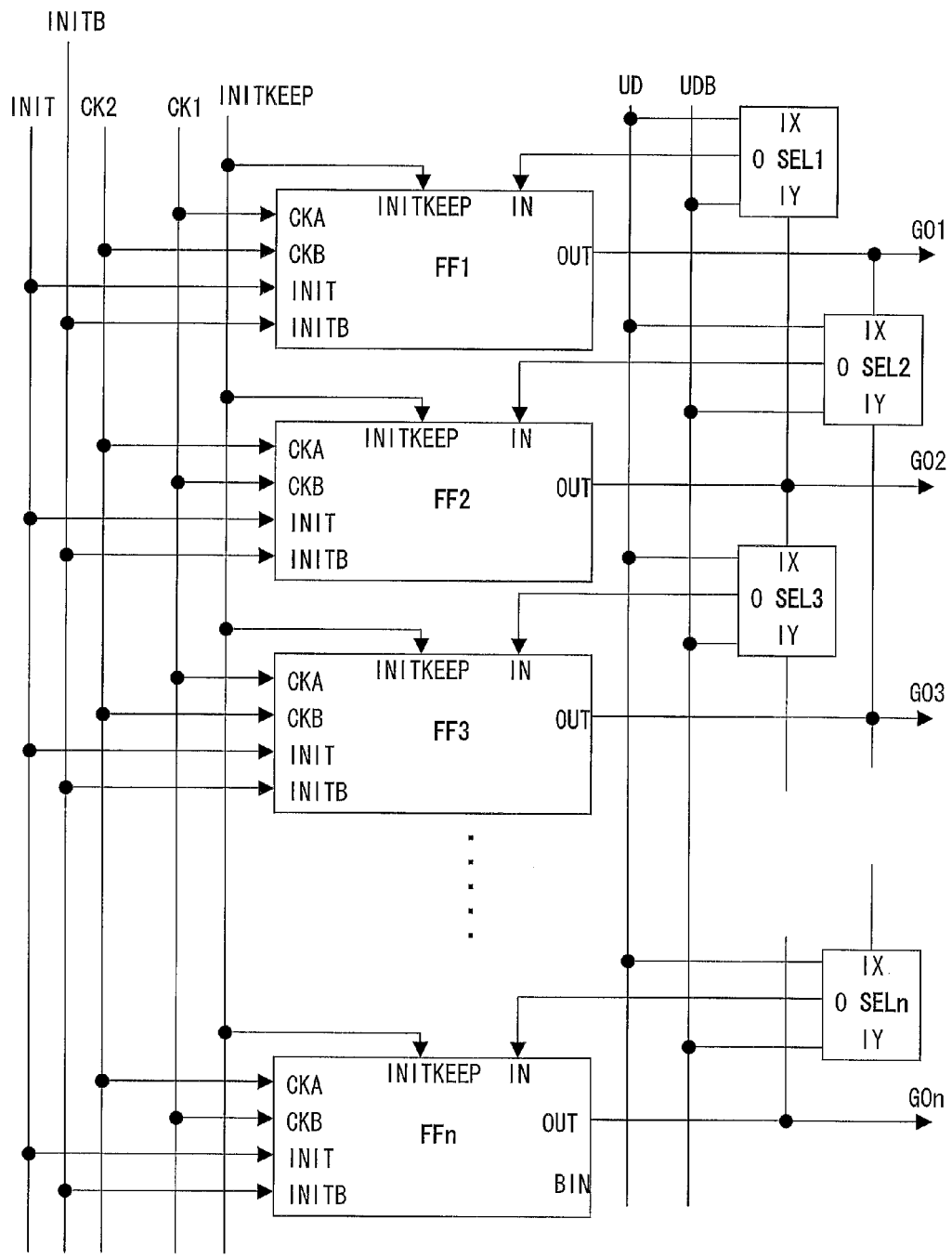

F I G. 3 0
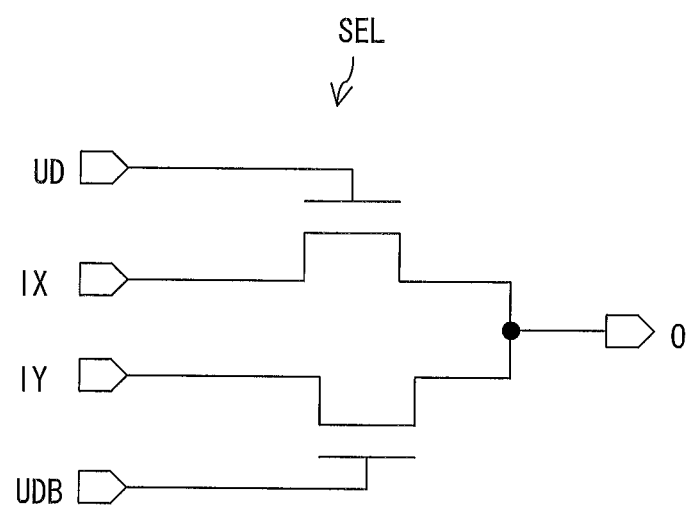

SIGNAL PROCESSING CIRCUIT, INVERTER CIRCUIT, BUFFER CIRCUIT, LEVEL SHIFTER, FLIP-FLOP, DRIVER CIRCUIT, AND DISPLAY DEVICE

TECHNICAL FIELD

The present invention relates to a signal processing circuit for use in a display device.

BACKGROUND ART

Patent Literature 1 (see FIG. 31) discloses a bootstrap-type inverter circuit including n channel transistors Tr101 through Tr105. The inverter circuit of FIG. 31 is arranged as follows: When a high potential (High) is inputted to an IN terminal, the transistor Tr105 is switched ON, and VSS (Low) is supplied to an OUT terminal. When the IN terminal is set to a low potential (Low) in the above state, the transistor Tr101 is switched OFF and the transistor Tr102 is switched ON. This charges a node n to the level of "VDD−Vth" (where Vth represents the threshold of each n channel transistor). When the above charging causes a current to flow through the transistor Tr104 (that is, increases the source potential of the transistor Tr104), a bootstrap capacitor C101 pumps up the potential of the node n, so that the node n has "VDD−Vth+α". This arrangement allows the OUT terminal to receive VDD (High) that is free from a threshold drop.

CITATION LIST

Patent Literature 1

Japanese Patent Application Publication, Tokukai, No. 2008-268261 A (Publication Date: Nov. 6, 2008)

SUMMARY OF INVENTION

Technical Problem

Unfortunately, if C101 is sufficiently large, the pumped up potential α will reach a value close to that of VDD (that is, the node n will have a high potential close to "2×VDD−Vth"). This may deteriorate or destroy Tr103.

It is an object of the present invention to increase reliability of a bootstrap-type signal processing circuit.

Solution to Problem

A signal processing circuit of the present invention includes: a first input terminal; a second input terminal; an output terminal; a first output section including a bootstrap capacitor and connected to the second input terminal and the output terminal; a second output section connected to the first input terminal, a first power source (that is, a power source corresponding to a potential that causes the first input terminal to be inactive), and the output terminal; an electric charge control section for controlling an electric charge of the bootstrap capacitor, the electric charge control section being connected to the first input terminal; and a relay section by which the electric charge control section and the first output section are electrically (i) connected to each other or (ii) separated from each other, the electric charge control section including a resistor connected to a second power source (that is, a power source corresponding to a potential that causes the first input terminal to be active).

The above provision of the relay section allows the first output section to carry out a bootstrap operation, and also prevents a high potential caused by a bootstrap operation from being applied to the electric charge control section. This arrangement prevents a transistor of the electric charge control section from being deteriorated or destroyed, and can thus increases reliability. In addition, the use of a resistor (connected to the second power source) in the electric charge control section increases the degree of freedom in layout, and can thus reduce the circuit area.

Advantageous Effects of Invention

As described above, the present invention can increase reliability of a bootstrap-type signal processing circuit.

BRIEF DESCRIPTION OF DRAWINGS

FIG. 2 is a timing chart illustrating an operation of the inverter circuit of FIG. 1.

FIG. 4 is a timing chart illustrating an operation of the inverter circuit of FIG. 3.

FIG. 5 is a circuit diagram illustrating still another configuration of the inverter circuit of the present invention.

FIG. 6 is a circuit diagram illustrating still another configuration of the inverter circuit of the present invention.

FIG. 7 is an example layout of the inverter circuit of FIG. 3.

FIG. 8 is a circuit diagram illustrating a configuration of an inverter-buffer circuit including the inverter circuit of the present invention.

FIG. 9 is a circuit diagram illustrating a variation of the inverter-buffer circuit of FIG. 8.

FIG. 13 is an explanatory diagram illustrating input signals suitable for the inverter-buffer circuits of FIGS. 8 through 11.

FIG. 14 is a circuit diagram illustrating a configuration of a flip-flop.

FIG. 15 is a block diagram illustrating a configuration of a liquid crystal display device of the present invention.

FIG. 17 is a timing chart illustrating an operation of a shift register of FIG. 3.

FIG. 18 is an explanatory diagram illustrating a method for generating first to third initialization signals.

FIG. 23 is a variation of the flip-flop illustrated in FIG. 14.

FIG. 24 is another variation of the flip-flop illustrated in FIG. 14.

FIG. 26 is still another variation of the flip-flop illustrated in FIG. 14.

FIG. 27 is still another variation of the flip-flop illustrated in FIG. 14.

FIG. 28 is still another variation of the flip-flop illustrated in FIG. 14.

FIG. 29 is a circuit diagram illustrating an example configuration of a shift register (bi-directional shift) including the flip-flop of FIG. 28.

FIG. 30 is an example of a shift direction determining circuit for use in the shift register of FIG. 29.

FIG. 31 is a diagram illustrating a configuration of a conventional inverter circuit.

DESCRIPTION OF EMBODIMENTS

An embodiment of the present invention is described below with reference to FIGS. 1 through 30.

Figure 1:
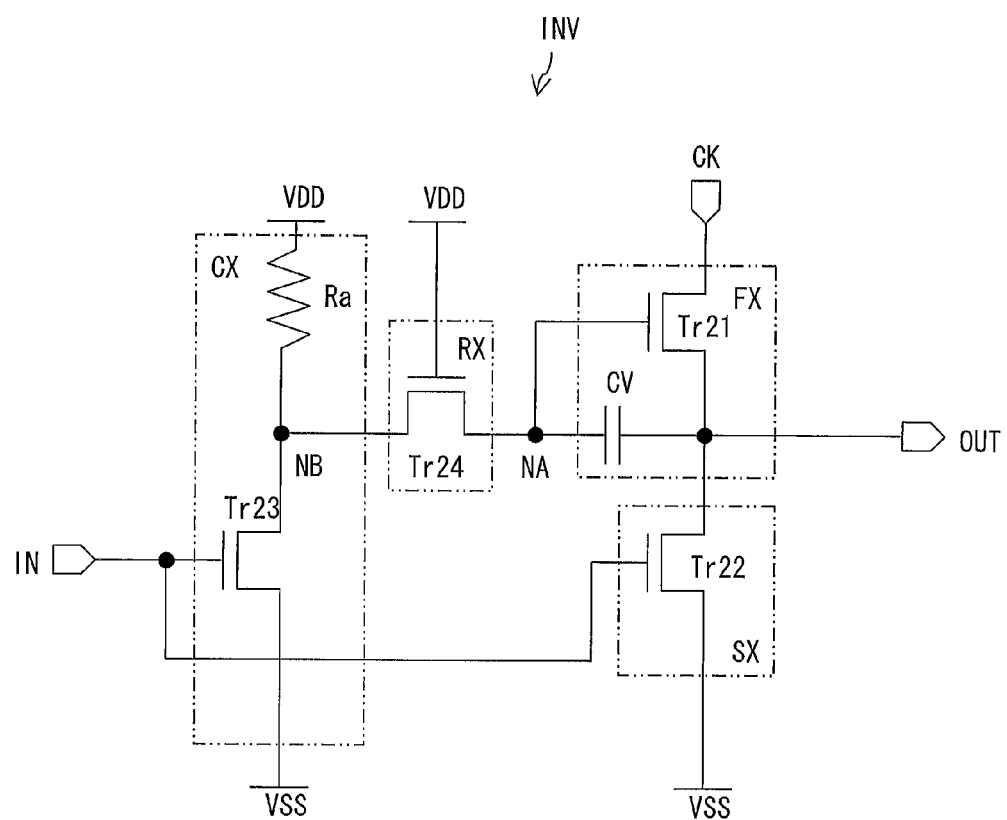
FIG. 1 is a circuit diagram illustrating a configuration of an inverter circuit of the present invention.

FIG. 1 is a circuit diagram illustrating a configuration of an inverter circuit INV of the present embodiment. As illustrated in FIG. 1, the inverter circuit INV has an IN terminal (first input terminal), a CK terminal (second input terminal), and an OUT terminal (output terminal). The inverter circuit INV includes: a first output section FX that includes a bootstrap capacitor CV and that is connected to the CK terminal and the OUT terminal; a second output section SX that is connected to the IN terminal and also to VSS (first power source) and the OUT terminal; an electric charge control section CX that is connected to the IN terminal and that controls the electric charge of the bootstrap capacitor CV; and a relay circuit RX that either electrically connects the electric charge control section CX and the first output section FX to each other or electrically blocks the electric charge control section CX and the first output section FX from each other.

More specifically, (i) the first output section FX includes a bootstrap capacitor CV and a transistor Tr21, (ii) the second output section SX includes a transistor Tr22, (iii) the electric charge control section CX includes a resistor Ra and a transistor Tr23, and (iv) the relay circuit RX includes a transistor Tr24. The transistor Tr21 has a gate electrode and a source electrode that are connected to each other via the bootstrap capacitor CV, and has a drain electrode connected to the CK terminal. The source electrode of the transistor Tr21 is further connected to the OUT terminal. The transistors Tr22 and Tr23 each have a gate electrode connected to the IN terminal. The transistor Tr24 has a gate electrode connected to VDD. The gate electrode of the transistor Tr21 is connected to a node NA, which is in turn connected to a node NB via the transistor Tr24. The node NB is connected to VDD via the resistor Ra, and is further connected to the first power source VSS via the transistor Tr23. The OUT terminal is connected to the first power source VSS via the transistor Tr22.

The inverter circuit INV of FIG. 1 operates as illustrated in FIG. 2. Specifically, when the IN terminal becomes inactive (Low), the node NA is charged to a level close to "VDD potential–Vth" (where Vth represents the threshold). This switches the transistor Tr24 OFF and the transistor Tr21 ON. Then, when a CK signal rises, the potential of the node NA is pumped up through the bootstrap capacitor CV. This allows the OUT terminal to output a CK signal that is free from a potential drop (threshold drop). Next, when the IN terminal becomes active (High), (i) the transistor Tr23 is switched ON, which in turn discharges the bootstrap capacitor CV, and (ii) the transistor Tr22 is switched ON, which in turn causes the OUT terminal to output VSS (Low).

Figure 3:
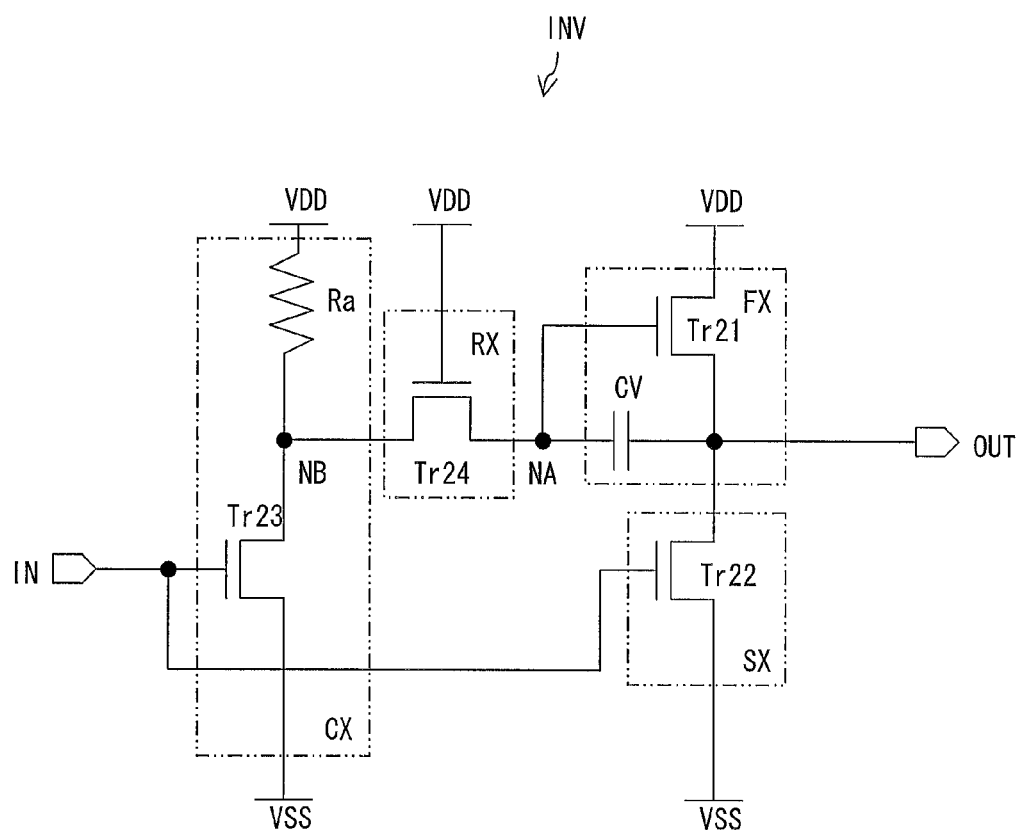
FIG. 3 is a circuit diagram illustrating another configuration of the inverter circuit of the present invention.

The inverter circuit INV of the present embodiment may alternatively be arranged as illustrated in FIG. 3. Specifically, the inverter circuit INV may be arranged such that the transistor Tr21 of the first output section FX has a drain electrode connected to VDD. In this case, as illustrated in FIG. 4, when the IN terminal becomes inactive (Low), the node NA is charged to a level close to "VDD potential–Vth" (where Vth represents the threshold). This switches the transistor Tr24 OFF, and causes a current to flow through the transistor Tr21. This in turn pumps up the potential of the node NA through the bootstrap capacitor CV, and causes the OUT terminal to output a VDD potential that is free from a potential drop (threshold drop). When the IN terminal becomes active (High), (i) the transistor Tr23 is switched ON, which in turn discharges the bootstrap capacitor CV, and (ii) the transistor Tr22 is switched ON, which in turn causes the OUT terminal to output VSS (Low).

The inverter circuit INV of the present embodiment is arranged such that the transistor Tr24 of a relay section RX is OFF during a bootstrap operation. This can achieve two advantages: (i) causing the node NA to be floating so that a bootstrap operation can be carried out and (ii) allowing the transistor Tr23 to remain protected even if the node NA is set to a high potential. The resistor Ra may be replaced by a diode-connected transistor. This will, however, increase the circuit area since a transistor is lower in layout freedom than a resistor. Further, it is possible to replace the resistor Ra by a diode-connected transistor and remove the transistor Tr24 (a bootstrap operation can be carried out even in this case). This will, however, deprive the node NA of its voltage resistance to a high voltage (which may deteriorate or break the transistor Tr23). In view of these points, the inverter circuit INV of the present embodiment includes the transistor Tr24 and a resistor Ra in order to achieve both layout freedom and voltage resistance. Note that the inverter circuit INV of the present embodiment functions also as a level shifter in the case where the IN signal has (i) a High potential not smaller than "VSS potential+Vth" (where Vth is the threshold voltage of each n channel transistor) and (ii) a Low potential not larger than "VSS+Vth".

The inverter circuit of FIG. 1 may alternatively be configured as illustrated in FIG. 5. Specifically, the OUT terminal may be connected to the first power source VSS via a capacitor. This can accelerate the bootstrap operation. Similarly, the inverter circuit of FIG. 3 may alternatively be configured as illustrated in FIG. 6. Specifically, the OUT terminal may be connected to the first power source VSS via a capacitor. This can accelerate the bootstrap operation.

FIG. 7 illustrates an example layout of the inverter circuit INV of FIG. 3. The inverter circuit INV includes, sequentially from a substrate side: a layer for forming channels of the respective transistors; a gate insulating layer; a layer for forming gate electrodes of the respective transistors; an interlayer insulating layer; and a signal wiring (including a power supply line). The resistor Ra can be, as illustrated in FIG. 7, made of the material (channel material) for forming the channels of the respective transistors. Since a channel material such as Si is far larger in resistance value than metal, the above arrangement can reduce not only the layout area of the resistor Ra but also the number of contact holes. Further, superimposing the resistor Ra, made of the channel material, over a VDD line as illustrated in FIG. 7 can reduce the layout area even further. In addition, the bootstrap capacitor CV may be provided at an overlapping portion at which (i) an electrode made of the material for forming the channels of the respective transistors (the electrode being connected to the source electrode of the transistor Tr21 through a contact hole), (ii) the gate electrode of the transistor Tr21, and (iii) a gate insulating film overlap one another. This arrangement also can reduce the number of contact holes and the layout area.

The inverter circuit INV of the present embodiment can be used to provide an inverter-buffer circuit (that is, a circuit that has both an inverter function and a buffer function). FIG. 8 illustrates an inverter-buffer circuit INBU including (i) transistors Tr21 through Tr24, Tr41, Tr42, and Tr44, (ii) a resistor Ra, (iii) bootstrap capacitors CV and CV', and (iv) nodes NA, NB, NC, and ND. The transistor Tr41 and the bootstrap capacitor CV' together provide a third output section, and the transistor Tr42 provides a fourth output section.

The transistor Tr21 has a gate electrode and a source electrode that are connected to each other via the bootstrap capacitor CV, and has a drain electrode that is connected to a VDD terminal. The source electrode of the transistor Tr21 is connected to an OUT terminal, and is also connected to the first power source VSS via the transistor Tr22. The transistor Tr41 has a gate electrode and a source electrode that are connected to each other via the bootstrap capacitor CV', and has a drain electrode that is connected to the VDD terminal. The source electrode of the transistor Tr41 is connected to an OUTB terminal, and is also connected to the first power source VSS via the transistor Tr42. The transistors Tr22 and Tr23 each have a gate electrode connected to the node ND and the IN terminal. The transistor Tr24 has a gate electrode connected to the VDD terminal. The gate electrode of the transistor Tr41 is connected to the node NC. The transistor Tr44 has a gate electrode connected to the VDD terminal. The nodes NA and NB are connected to each other via the transistor Tr24. The nodes NC and ND are connected to each other via the transistor Tr44. The node NB is connected to (i) the first power source VSS via the transistor Tr23 and (ii) the VDD terminal via the resistor Ra.

The inverter-buffer circuit INBU of FIG. 8 is arranged such that (i) a Low potential is outputted to the OUTB terminal and a High potential is outputted to the OUTB terminal when the IN terminal is High (the transistors Tr22 and Tr41 are ON) and that (ii) a High potential is outputted to the OUT terminal and a Low potential is outputted to the OUTB terminal when the IN terminal is Low (the transistors Tr21 and Tr42 are ON). The inverter-buffer circuit INBU of FIG. 8 may alternatively be arranged such that the gate electrode of the transistor Tr42 is connected to the OUT terminal as illustrated in FIG. 9 instead of the node NB.

Figure 10:
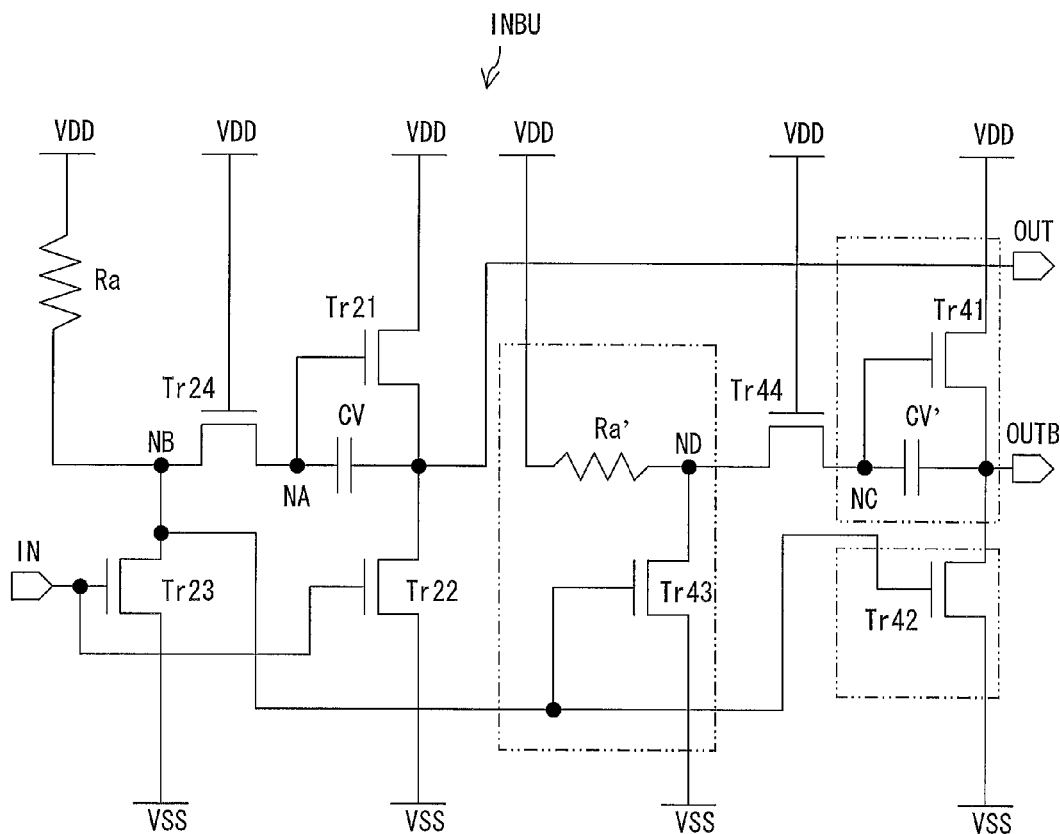
FIG. 10 is a circuit diagram illustrating another configuration of the inverter-buffer circuit including the inverter circuit of the present invention.

FIG. 10 illustrates an inverter-buffer circuit INBU including transistors Tr21 through Tr24 and Tr41 through Tr44, resistors Ra and Ra', bootstrap capacitors CV and CV', and nodes NA, NB, NC, and ND. The transistor Tr41 and the bootstrap capacitor CV' together provide a third output section, and the transistor Tr42 provides a fourth output section.

The transistor Tr21 has a gate electrode and a source electrode that are connected to each other via the bootstrap capacitor CV, and has a drain electrode that is connected to a VDD terminal. The source electrode of the transistor Tr21 is connected to an OUT terminal, and is also connected to the first power source VSS via the transistor Tr22. The transistor Tr41 has a gate electrode and a source electrode that are connected to each other via the bootstrap capacitor CV', and has a drain electrode that is connected to the VDD terminal. The source electrode of the transistor Tr41 is connected to an OUTB terminal, and is also connected to the first power source VSS via the transistor Tr42. The transistors Tr22 and Tr23 each have a gate electrode connected to the IN terminal. The transistor Tr24 has a gate electrode connected to the VDD terminal. The gate electrode of the transistor Tr41 is connected to the node NC. The transistor Tr44 has a gate electrode connected to the VDD terminal. The nodes NA and NB are connected to each other via the transistor Tr24. The nodes NC and ND are connected to each other via the transistor Tr44. The transistor Tr43 has a gate terminal connected to the node NB, and is further connected to the first power source VSS via the transistor Tr23. The transistors Tr42 and Tr43 each have a gate terminal connected to the node NB, which is in turn connected to the VDD terminal via the resistor Ra. The node ND is connected to the first power source VSS via the transistor Tr43, and is further connected to the VDD terminal via the resistor Ra'.

Figure 11:
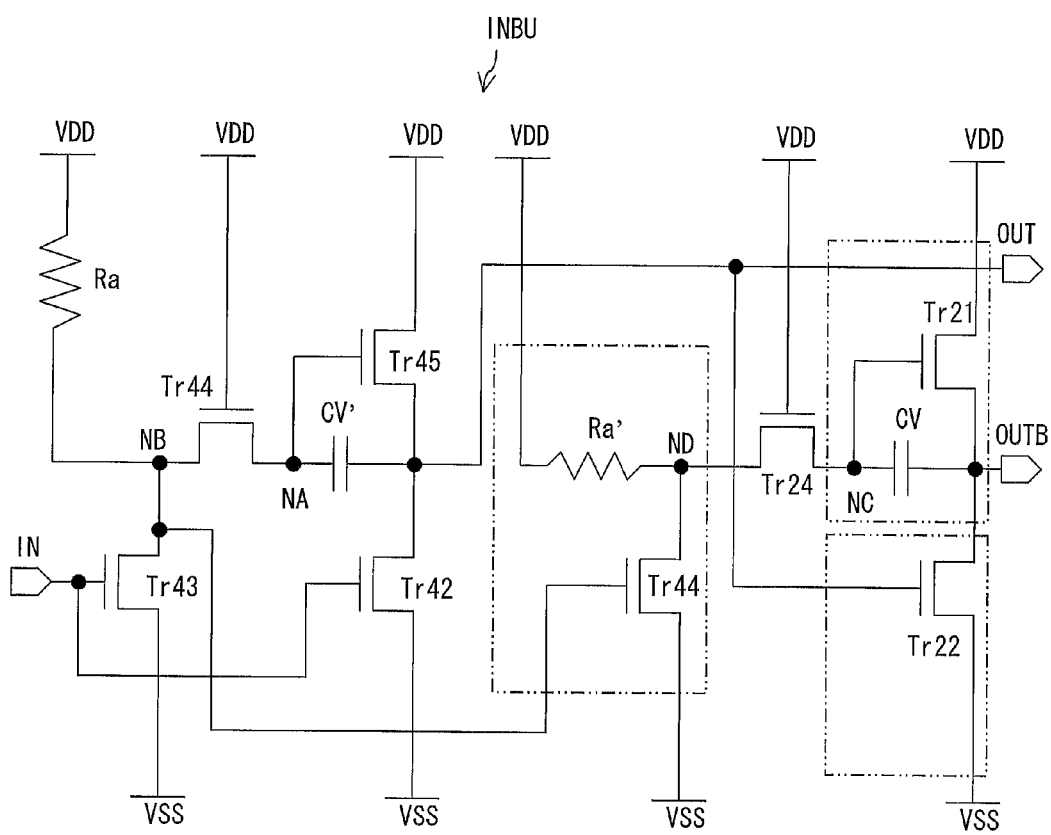
FIG. 11 is a circuit diagram illustrating a variation of the inverter-buffer circuit of FIG. 10.
Figure 12:
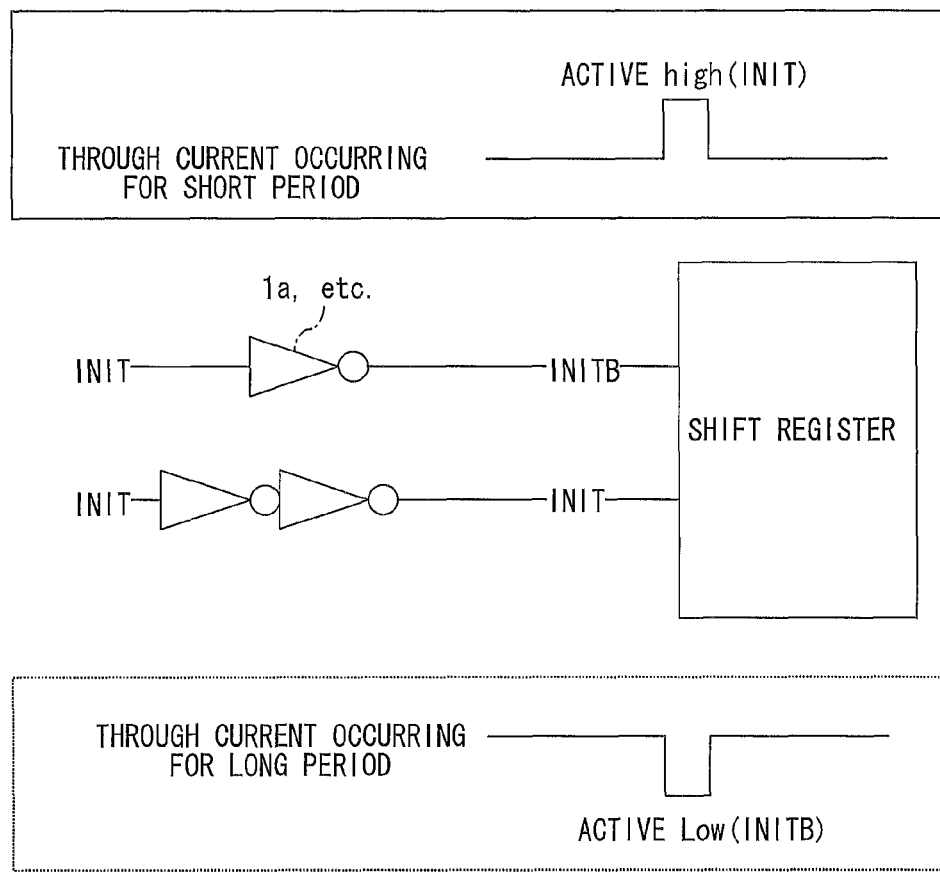
FIG. 12 is an explanatory diagram illustrating input signals suitable for the inverter circuit of the present invention.

The inverter-buffer circuit INBU of FIG. 10 is arranged such that (i) a Low potential is outputted to the OUT terminal and a High potential is outputted to the OUTB terminal when the IN terminal is High (the transistors Tr22 and Tr41 are ON) and that (ii) a High potential is outputted to the OUT terminal and a Low potential is outputted to the OUTB terminal when the IN terminal is Low (the transistors Tr21 and Tr42 are ON). The inverter-buffer circuit INBU of FIG. 10 may alternatively be arranged such that the gate electrode of the transistor Tr42 is connected to the OUT terminal as illustrated in FIG. 11 instead of the node NB.

The inverter circuit INV of, for example, FIG. 1 involves a through current occurring through the transistor Tr23 when the IN terminal is High. The IN terminal thus desirably receives a signal having a High period shorter than a Low period, that is, a signal that is High during an active period (see FIG. 12). This reduces power consumption caused by a through current. The above inverter circuit INV is thus suitable for the case in which, for instance, an inversion signal INTB is generated from an initialization signal INIT (active High, described later in detail) of a shift register (see FIG. 12). For the case in which an inversion signal INTB and a buffer signal INIT are generated from an initialization signal INIT (active High), any of the inverter-buffer circuits INBU illustrated in FIGS. 8 through 11 may be used (see FIG. 13).

FIG. 15 illustrates one example configuration of a liquid crystal display device including a flip-flop of the present invention. The liquid crystal display device illustrated in FIG. 15 includes a display controller, a gate driver GD, a source driver SD, a liquid crystal panel LCP, and a backlight BL (which is used in a case where the liquid crystal display device is of a light transmissive type). The display controller controls the gate driver GD and the source driver SD. For example, the display controller supplies, to the gate driver GD, first and second clock signals (CK1 signal and CK2 signal, respectively), a gate start pulse signal (GSP signal), a first initialization signal (INIT signal), a second initialization signal (INITB signal), and a third initialization signal (INIT-KEEP signal). The gate driver GD drives scanning signal lines G1 through Gn of the liquid crystal panel LCP, while the source driver SD drives data signal lines S1 through Sn of the liquid crystal panel LCP.

Figure 16:
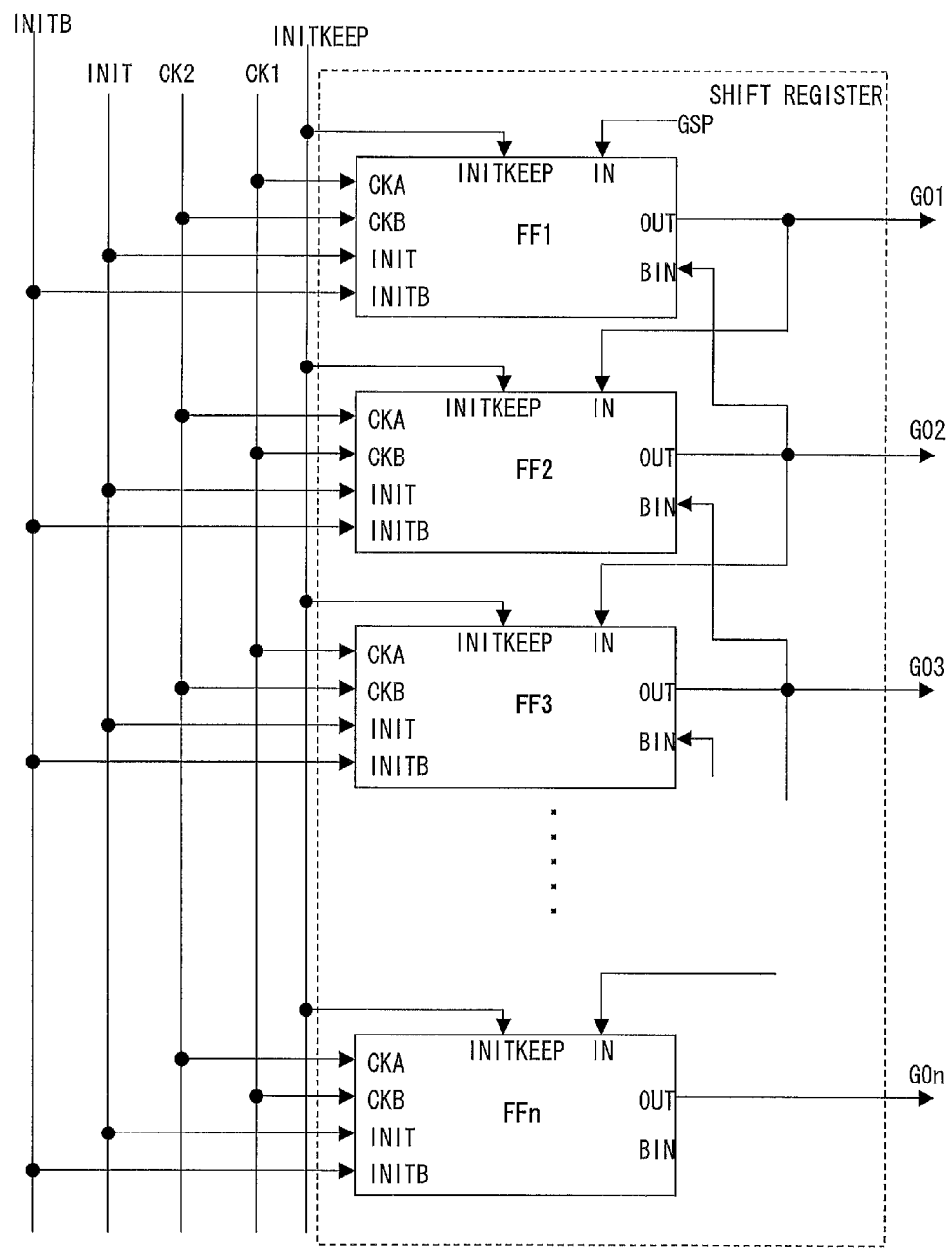
FIG. 16 is a circuit diagram illustrating an example configuration of a shift register of the present invention.

The gate driver GD includes a shift register illustrated in FIG. 16. The shift register illustrated in FIG. 16 includes a plurality of flip-flops that are cascaded with one another. Each of the flip-flops includes an input terminal (IN terminal), an output terminal (OUT terminal), first and second clock signal terminals (first and second control signal terminals) CKA and CKB, a first initialization terminal (INIT terminal), a second initialization terminal (INITB terminal), a third initialization terminal (INITKEEP terminal), and a backin terminal (BIN terminal).

Here, in flip-flops at odd-numbered stages (FF1, FF3, etc.), the CK1 signal is supplied to the CKA terminal, and the CK2 signal is supplied to the CKB terminal. In flip-flops at even-numbered stages (FF2, FFn, etc.), the CK2 signal is supplied to the CKA terminal, and the CK1 signal is supplied to the CKB terminal. Further, the INIT signal, the INITB signal, and the INITKEEP signal are supplied to each of the flip-flops (FF1 through FFn). Still further, an IN terminal of one flip-flop stage is connected to an OUT terminal of a preceding flip-flop stage, and a BIN terminal of the one flip-flop stage is connected to an OUT terminal of a subsequent flip-flop stage. Note that the CK1 and CK2 signals are two clock signals arranged such that their active periods (High periods) do not overlap each other.

As each stage of the shift register illustrated in FIG. 16, the flip-flop according to the present invention is used. FIG. 14 illustrates an example configuration of the flip-flop according to the present invention. The flip-flop illustrated in FIG. 14 has an IN terminal, an OUT terminal, CKA and CKB terminals, and a bootstrap capacitor Cv. The flip-flop illustrated in FIG. 14 includes: a first output section FO that is connected to the CKA terminal and the OUT terminal; a second output section SO that is connected to a first power source VSS (low-level power source) and the OUT terminal; a first input section FI that is connected to the IN terminal and a second power source VDD (high-level power source) and that charges the bootstrap capacitor Cv; a discharging section DC that discharges the bootstrap capacitor Cv; a second input section SI that is connected to the IN terminal and the first power source VSS and that is further connected to the second output section; a resetting section RS that is connected to the CKB terminal and that controls the discharging section DC and the second output section SO; a first initialization section FT that controls the first output section FO; a second initialization section SD that controls the first input section FI; a third initialization section TD that controls the discharging section DC and the second output section SO; a feedback section FB that is connected to the OUT terminal and that controls the second output section SO; a relay section RC that relays the first input section FI and the first output section FO; and a malfunction preventing section SC that prevents one flip-flop stage and other flip-flop stage(s) from becoming active at the same time during a regular operation.

More specifically, the flip-flop according to the present invention is configured such that: the first output section FO includes a transistor Tr1 (first transistor) and the bootstrap capacitor Cv; the second output section SO includes a second transistor Tr2 (second transistor); the first input section FI includes a transistor Tr3 (third transistor) and a resistor Ri; the discharging section DC includes a transistor Tr4 (fourth transistor); the second input section SI includes a transistor Tr5 (fifth transistor); the resetting section RS includes a transistor Tr6 (sixth transistor) and a resistor Rr; the first initialization section FT includes a transistor Tr7 (seventh transistor) and a transistor Tr11 (eleventh transistor); the second initialization section includes a transistor Tr8 (eighth transistor) and a transistor Tr10 (tenth transistor); the third initialization section includes a transistor Tr9 (ninth transistor); the feedback section FB includes a transistor Tr12 (twelfth transistor); the relay section RC includes a transistor Tr13 (thirteenth transistor); and the malfunction preventing section SC includes transistors Tr14 and Tr15. Note that all the transistors Tr1 through Tr15 are of the same conductivity-type (n-channel type).

Further, the transistor Tr1 is arranged such that: a drain electrode of the transistor Tr1 is connected to the CKA terminal; a gate electrode and a source electrode of the transistor Tr1 are connected to each other via the bootstrap capacitor Cv; and the source electrode is connected to the OUT terminal, and is also connected to the first power source VSS via the transistor Tr2.

In addition, gate terminals of the respective transistors Tr3, Tr5, and Tr14 are connected to the IN terminal; a gate terminal of the transistor Tr6 is connected to the CKB terminal; gate terminals of the respective transistors Tr7 and Tr11 are connected to the INIT terminal; gate terminals of the respective transistors Tr8 and Tr10 are connected to the INITB terminal; a gate terminal of the transistor Tr9 is connected to the INITKEEP terminal; a gate terminal of the transistor Tr13 is connected to the second power source VDD; and a gate terminal of the transistor Tr15 is connected to the BIN terminal.

Further, a first node Na connected to the gate terminal of the transistor Tr1 is connected to one end of the resistor Ri via the transistor Tr13, and is further connected to the first power source VSS via the transistor Tr4. The other end of the resistor Ri is connected to the second power source VDD via the transistors Tr3 and Tr8 (Note that the transistor Tr3 is located on the side of the resistor Ri, while the transistor Tr8 is located on the side of the second power source VDD.).

Still further, a second node Nb connected to a gate terminal of the transistor Tr2 is connected to (i) the first power source VSS via the transistor Tr5, (ii) the first power source VSS via the transistor Tr11, and (iii) the first power source VSS via the transistor Tr12. In addition, a third node Nc connected to a gate terminal of the transistor Tr4 is connected to the second power source VDD via the transistor Tr9, and is further connected to the second power source VDD via the resistor Rr and the transistor Tr6 (Note that the resistor Rr is located on the side of the third node Nc, while the transistor Tr6 is located on the side of the second power source VDD.). The second node Nb and the third node Nc are connected to each other via the transistor Tr10. The third node Nc is connected to the second power source VDD via the transistors Tr15 and Tr14 (Note that the transistor Tr15 is located on the side of the third node Nc, while the transistor Tr14 is located on the side of the second power source VDD.).

The operation of the shift register according to the present invention is illustrated in FIG. 17. During an all-ON period, the INIT signal is active (High), the INITB signal is active (Low), and the INITKEEP signal is active (High). The bootstrap capacitor Cv is thus discharged by the discharging section DC (since the transistors Tr9 and Tr4 are switched ON, while the transistor Tr1 is switched OFF.). This causes the first output section FO to become inactive, and also causes the second output section SO to become inactive (since the transistor Tr11 is switched ON, while the transistor Tr2 is switched OFF.). Thus, the source electrode of the transistor Tr1 in the first output section FO is connected to the second power source VDD by the first initialization section FT, so that a VDD potential (High) is reliably outputted to the OUT terminal regardless of the CK1 and CK2 signals. In the present configuration, since the second node is at the VSS potential and the third node is at the VDD potential, during the all-ON period, the transistor Tr10 is switched OFF by the INITB signal so that both the second node and the third node are blocked from each other. On the other hand, until the GSP signal becomes active after the completion of the all-ON period, the INIT signal is inactive (Low), the INITB signal is inactive (High), the INITKEEP signal is active (High), and the transistor Tr10 is switched ON. Consequently, the second output section SO becomes active (the transistor Tr2 is switched ON.). Accordingly, a VSS potential (Low) is reliably outputted to the OUT terminal regardless of the CK1 and CK2 signals.

The operation during a regular driving is as follows: During the regular driving, the INIT signal is inactive (Low), the INITB signal is inactive (High), and the INITKEEP signal is inactive (Low). Note that the INITKEEP signal becomes inactive (Low) in synchronization with the activation of the GSP signal (the transistors Tr8 and Tr10 are switched ON, while the transistors Tr7 and Tr9 are switched OFF.).

For example, in the flip-flop FF1 at the first stage (see FIG. 16), when the IN terminal becomes active (the GSP signal becomes active), the bootstrap capacitor Cv is charged so that a potential of the first node Na is pre-charged to about the level of "VDD potential−Vth" (where Vth is the threshold voltage of a transistor). At this time, since the CK2 signal is High (the CKB terminal is active), the transistors Tr5 and Tr6 are both switched ON, and the second node Nb becomes a VSS potential. This is because driving performance of the transistor Tr6 becomes higher than that of the transistor Tr5 due to a current limit of the resistor Rr. The VSS potential of the second node Nb is maintained even after the GSP signal becomes inactive (since the transistors Tr2, Tr12, and Tr4 stay OFF).

Here, when the CK1 signal rises, a potential of the first node Na is pumped up to a level equal to or greater than the VDD potential due to a bootstrap effect. This causes the CK1 signal (High) to be outputted from the OUT terminal (GO1), without suffering from a potential drop (so-called threshold drop). When the OUT terminal becomes High, the transistor Tr12 of the feedback section FB is switched ON, and the second node Nb reliably becomes the VSS potential. Note that when the CK1 signal falls, the bootstrap effect wears off, and the potential of the first node Na therefore returns to the level of "VDD potential−Vth". Subsequently, when the CK2 signal rises, the transistor Tr4 of the discharging section DC is switched ON. This causes the bootstrap capacitor Cv to be discharged, and causes the transistor Tr2 to be switched ON. Consequently, the VSS (Low) is outputted from the OUT terminal (GO1). This completes a reset (self-reset) of the flip-flop FF1.

Further, in the configuration illustrated in FIG. 14, the malfunction preventing section SC is provided. Therefore, in a case where outputs of the preceding flip-flop stage (flip-flop stage previous to the one flip-flop stage) and the subsequent flip-flop stage (flip-flop stage subsequent to the one flip-flop stage) become active during the regular operation, the transistors Tr14 and Tr15 are both switched ON, and the transistor Tr2 is switched ON, so that the OUT terminal can be forcibly set to the VSS potential (Low). Still further, in the configuration illustrated in FIG. 14, the relay circuit RC (Tr13) is provided. Therefore, when the potential of the first node Na is set to a level equal to or higher than a given level due to the bootstrap effect, the transistor Tr13 is switched OFF. This makes it possible to protect the transistor Tr4 of the discharging section DC from a high voltage.

Figure 19:
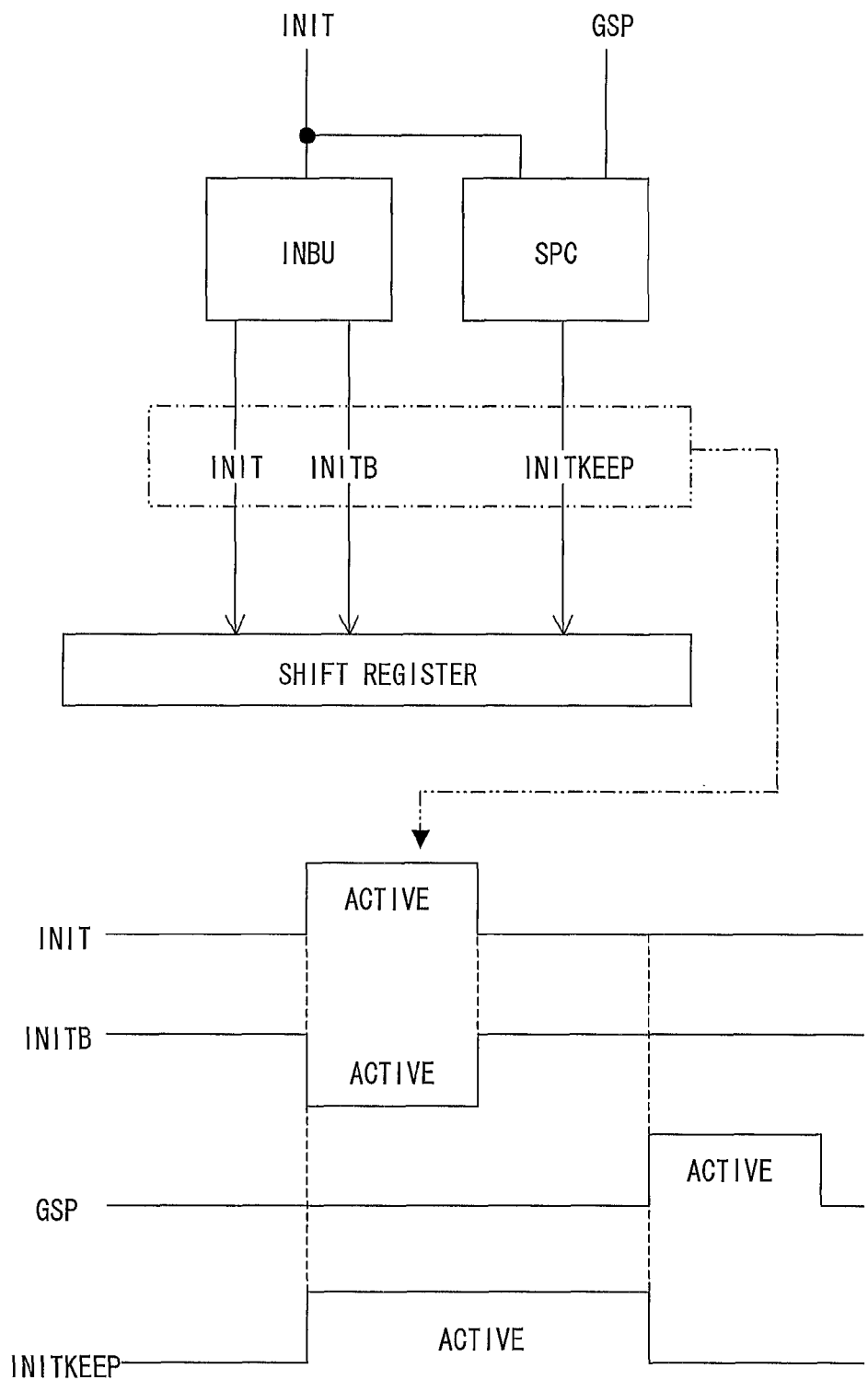
FIG. 19 is an explanatory diagram illustrating another method for generating the first to third initialization signals.

The INITB signal and the INITKEEP signal, which are inversion signals of the INIT signal, are generated from the INIT signal. That is, as illustrated in FIG. 18, an inverter circuit INV illustrated in, for example, FIG. 3 outputs the INTB signal from the INIT signal (i.e., inputs an INIT signal to the IN terminal of FIG. 3), and a signal processing circuit SPC generates the INITKEEP signal by using the INIT signal. Here, the INITB signal is an inversion signal of the INIT signal, and the INITKEEP signal becomes active (High) at a timing of transition of the INIT signal from active (High) to inactive (Low). After such a timing, the INITKEEP signal becomes inactive (Low) (for example, in synchronization with the activation of the GSP signal as illustrated in FIG. 17). Note that as illustrated in FIG. 19, the inverter-buffer circuits INBU illustrated in FIGS. 8 through 11 may each be used to generate an INTB signal and an INIT signal from an INIT signal (Specifically, an INIT signal is inputted to the IN terminal of any of FIGS. 8 through 11 to output (i) an INITB signal from the OUT terminal and (ii) an INIT signal from the OUTB terminal.).

Figure 20:
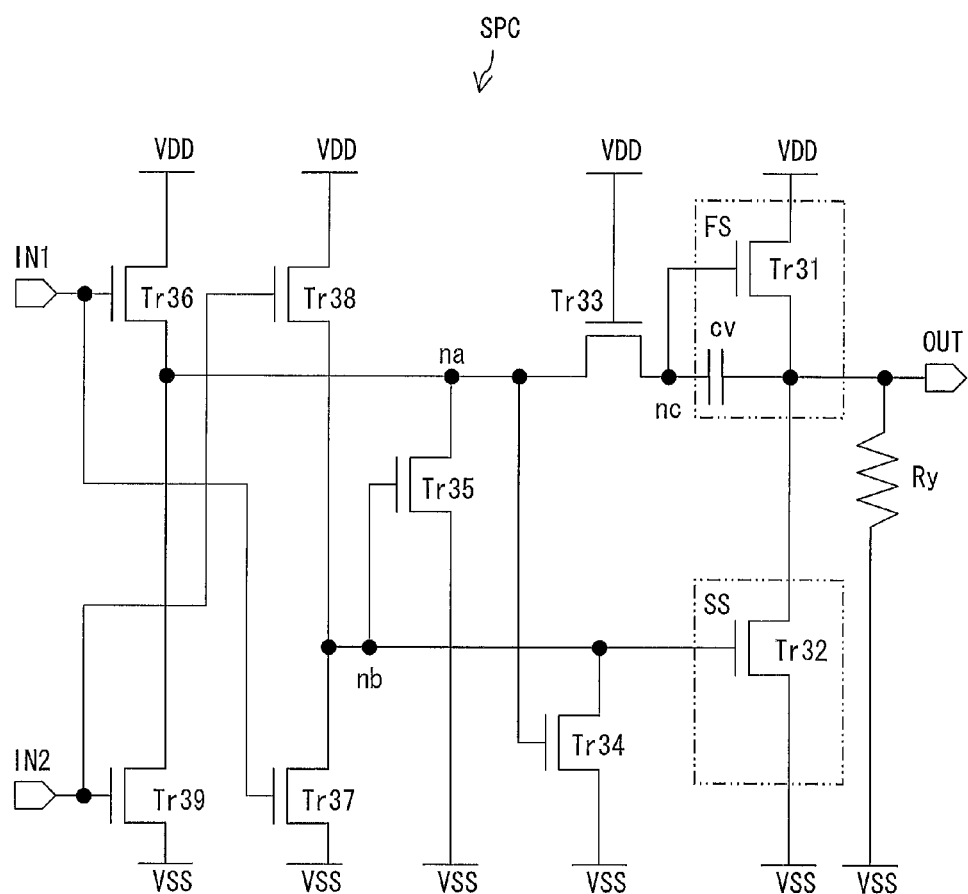
FIG. 20 is a circuit diagram illustrating a signal processing circuit for use in a driver of a liquid crystal display device of the present invention.

FIG. 20 illustrates an example configuration of the signal processing circuit SPC. The signal processing circuit SPC of FIG. 20 includes: an IN1 terminal (first input terminal) and an IN2 terminal (second input terminal); an OUT terminal (output terminal); a node na (first node) and a node nb (second node); a first signal generating section FS that is connected to VDD (first power source) and the OUT terminal and that includes a bootstrap capacitor cv; and a second signal generating section SS that is connected to the node nb, VSS (second power source), and the OUT terminal. When the IN1 terminal becomes active, the node na becomes active (High). When the IN2 terminal becomes active, the node nb becomes active (High). The OUT terminal is connected to the second power source VSS via a resistor Ry.

Specifically, the signal processing circuit SPC includes: a transistor Tr31 included in the first signal generating section FS; a transistor Tr32 included in the second signal generating section SS; and transistors Tr33 through Tr39. The transistor Tr31 has a drain electrode that is connected to the first power source VDD, and has a source electrode and a gate electrode that are connected to each other via the bootstrap capacitor cv, the source electrode being connected to the OUT terminal. The source electrode of the transistor Tr31 is connected to the second power source VSS via the resistor Ry, and is further connected to the second power source VSS via the transistor Tr32. The transistors Tr32 and Tr35 each have a gate electrode connected to the node nb. The transistor Tr34 has a gate electrode connected to the node na. The transistors Tr36 and Tr37 each have a gate electrode connected to the IN1 terminal. The transistors Tr38 and Tr39 each have a gate electrode connected to the IN2 terminal. The gate electrode of the transistor Tr31 is connected to the node nc, which is in turn connected to the node na via the transistor Tr33. The node na and the second power source VSS are connected to each other via the transistor Tr35. The node nb and the second power source VSS are connected to each other via the transistor Tr34. The node na and the first power source VDD are connected to each other via the transistor Tr36. The node na and the second power source VSS are further connected to each other via the transistor Tr39. The node nb and the first power source VDD are connected to each other via the transistor Tr38. The node nb and the second power source VSS are further connected to each other via the transistor Tr37.

The signal processing circuit SPC of FIG. 20 is arranged such that when the IN1 terminal becomes active (High) while the IN2 terminal is inactive (Low), the node na becomes active (High), and the node nb becomes inactive (Low) (that is, the transistors Tr36 and Tr37 are switched ON). This charges the bootstrap capacitor cv, and causes a current to flow through the transistor Tr31. This in turn pumps up the potential of the node nc through the bootstrap capacitor cv, and causes the OUT terminal to output a VDD potential (High) that is free from a potential drop (threshold drop). Then, when the IN1 terminal becomes inactive (Low) (while the IN2 terminal remains inactive), the nodes nc and nb each start floating. The OUT terminal thus continues to output the VDD potential (High). Next, when the IN2 terminal becomes active (High), the node nb becomes active (High), and the node na becomes inactive (Low) (that is, the transistors Tr38, Tr39, and Tr32 are switched ON). This causes the OUT terminal to output a VSS potential (Low). Therefore, with either of the respective arrangements of FIGS. 18 and 19, inputting an INIT signal to the IN1 terminal and a GSP signal to the IN2 terminal allows the OUT terminal to output an INITKEEP signal as illustrated in FIGS. 18 and 19.

In the case where the resistor Ry is set to have a high resistance value ranging from 0.5 to 5.5 megaohms, the initial value (that is, a source potential of the transistor Tr31 for a period until the IN1 terminal becomes active) of the OUT terminal can be set with use of the resistor Ry. With this arrangement, the bootstrap circuit of the first signal generating section FS functions normally when the IN1 terminal becomes active (High).

Figure 21:
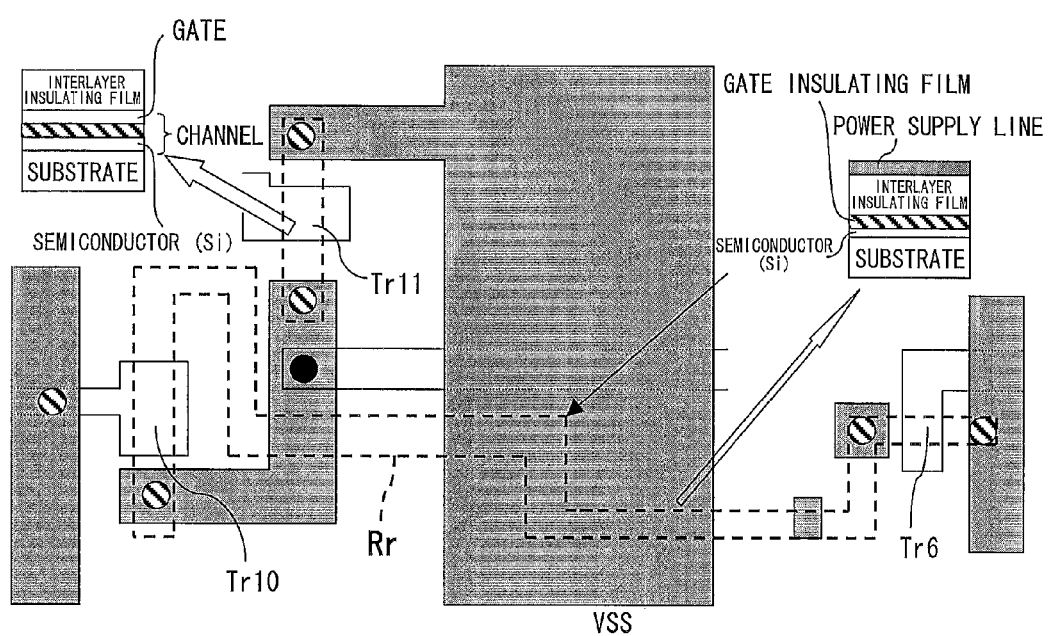
FIG. 21 is an example layout of the flip-flop of FIG. 14.
Figure 22:
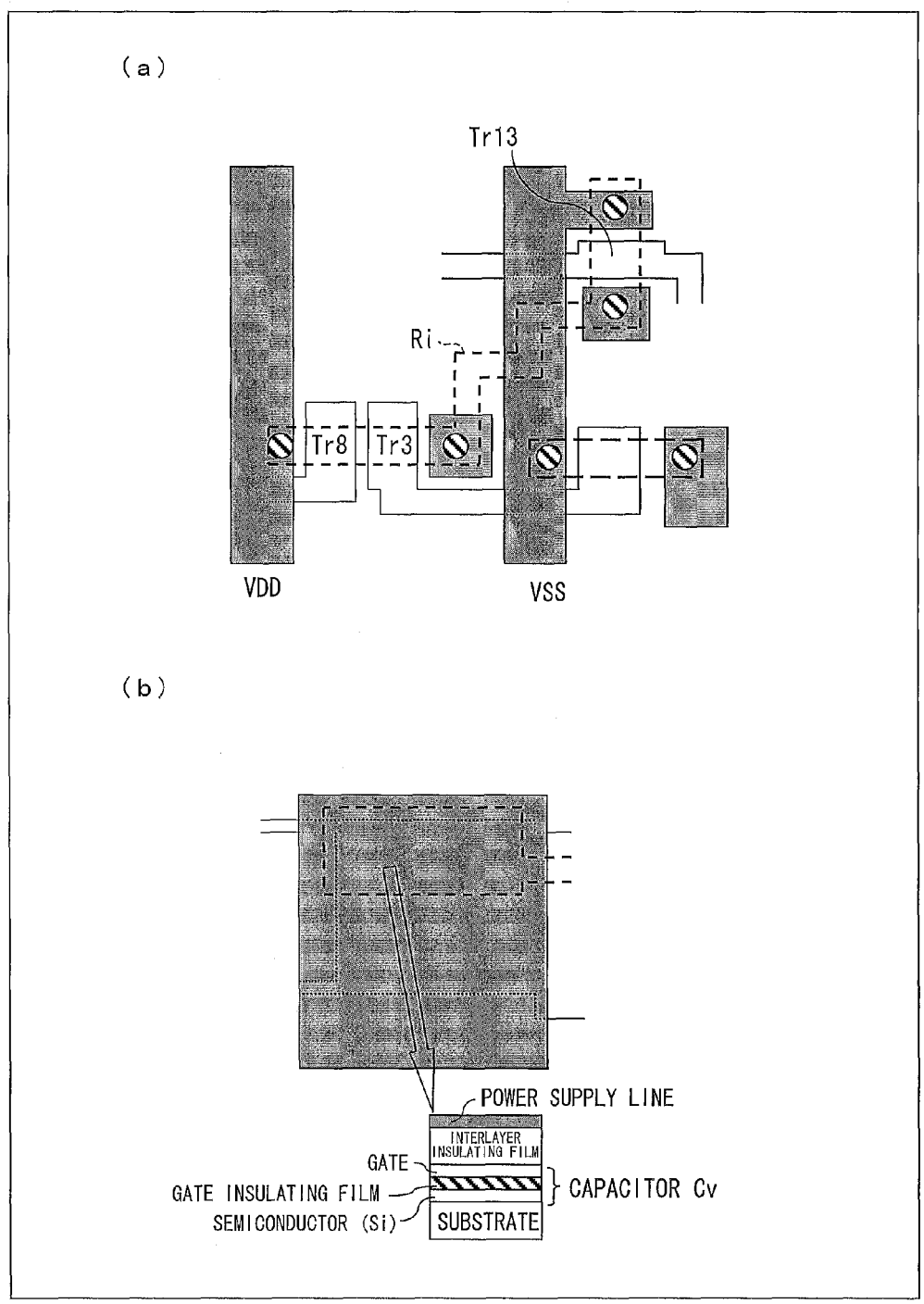
FIG. 22 is an example layout of the flip-flop of FIG. 14.

FIGS. 21 and 22 each illustrate an example layout of the flip-flop of FIG. 14. This flip-flop includes, sequentially from a substrate side: a layer for forming channels of the respective transistors; a gate insulating layer; a layer for forming gate electrodes of the respective transistors; an interlayer insulating layer; and a signal wiring (including a power supply line). The resistor Rr of the resetting section RS may be made of a material for forming the channels of the respective transistors (see FIG. 21), or the resistor Ri of the first input section FI may be made of a material for forming the channels of the respective transistors (see (a) of FIG. 22). Such an arrangement can reduce the number of contact holes and a layout area. Further, the bootstrap capacitor Cv of the first output section FO may be provided at an overlapping portion at which (i) an electrode made of the material for forming the channels of the respective transistors (the electrode being connected to the source electrode of the transistor Tr1 through a contact hole), (ii) the gate electrode of the transistor Tr1, and (iii) a gate insulating film overlap one another. This overlapping portion may further be overlapped with a VH (VDD) line (see (b) of FIG. 22). This arrangement also can reduce the layout area.

The above flip-flop may alternatively be configured as illustrated in FIG. 23, specifically by removing, from the configuration of FIG. 14, (i) the relay circuit RC and the malfunction preventing section SC (that is, the transistors Tr13 through Tr15) and also (ii) the transistor Tr11 of the first initialization circuit FT. The description below deals with an all-ON operation of the flip-flop of FIG. 23.

During an all-ON period, the INIT signal is active (High), the INITB signal is active (Low), and the INITKEEP signal is active (High). This causes the bootstrap capacitor Cv to be discharged by the discharging section DC (because the transistors Tr9 and Tr4 are switched ON, and the transistor Tr1 is switched OFF), which in turn causes the first output section FO to be inactive and the second output section SO to be floating (because the transistor Tr10 is switched OFF). However, the first initialization section FT causes the source electrode (OUT terminal) of the transistor Tr1 of the first output section FO to be connected to the first power source VDD. This allows a VDD potential (High) to be reliably outputted to the OUT terminal regardless of the CK1 and CK2 signals, and causes the node Nb to be inactive (Low) due to the transistor Tr12, thus switching the second output section SO OFF. On the other hand, until the GSP signal becomes active after the completion of the all-ON period, the INIT signal is inactive (Low), the INITB signal is inactive (High), and the INITKEEP signal is active (High). This switches the transistors Tr8 and Tr10 ON, and thus causes the second output section SO to be active (that is, switches the transistor Tr2 ON), which in turn allows a VSS potential (Low) to be reliably outputted to the OUT terminal regardless of the CK1 and CK2 signals.

Figure 25:
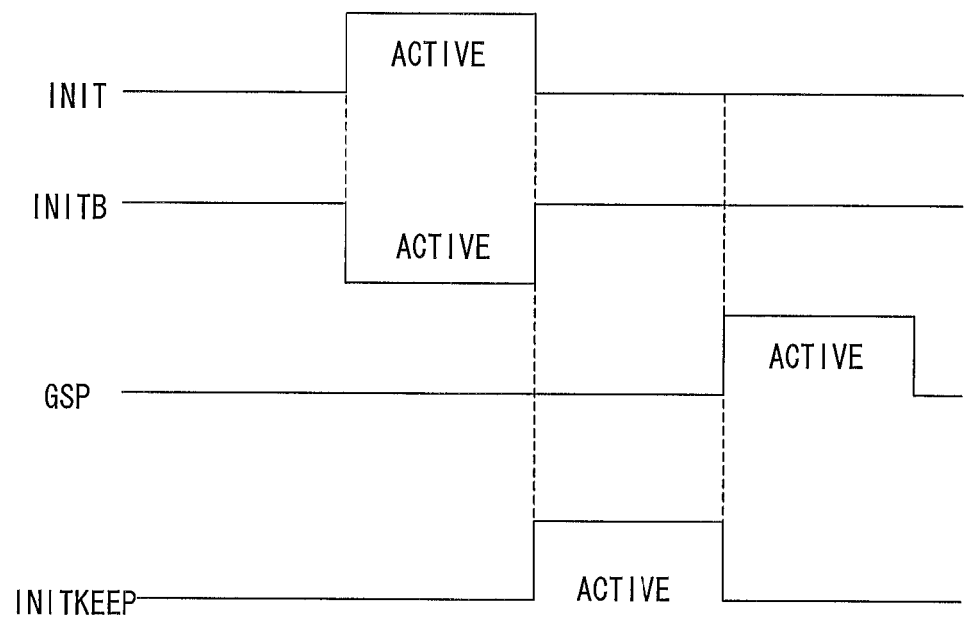
FIG. 25 is a timing chart for first to third initialization signals inputted to the flip-flop of FIG. 24.
Figure 3:
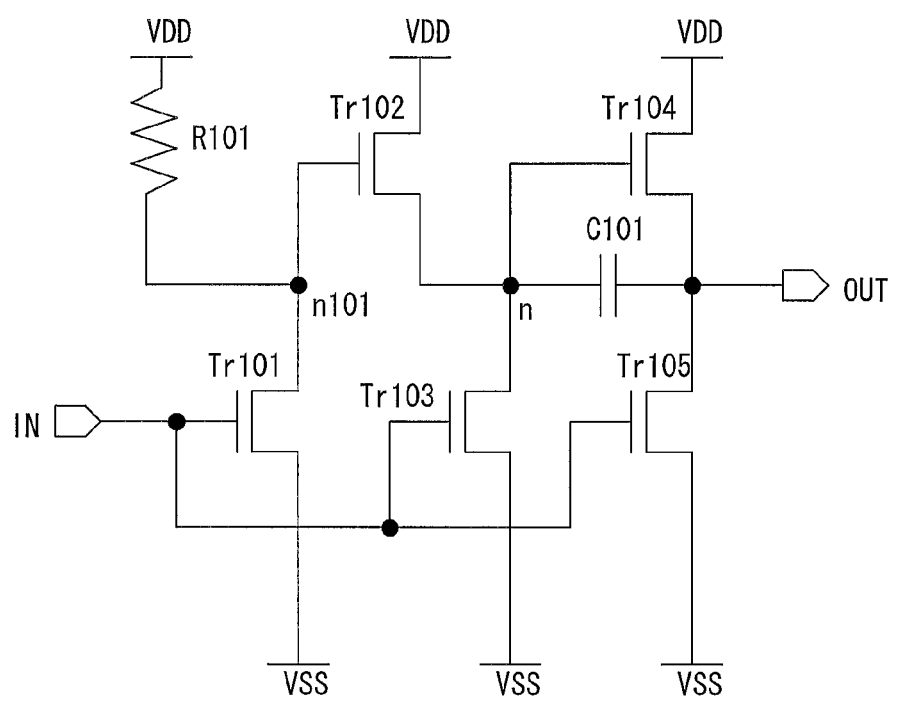

The above flip-flop may alternatively be (a) configured as illustrated in FIG. 24, specifically by removing, from the configuration of FIG. 14, (i) the relay circuit RC, the feedback section FB, and the malfunction preventing section SC (that is, the transistors Tr12 through Tr15) and also (ii) the transistor Tr11 of the first initialization circuit FT and the transistor Tr10 of the second initialization circuit FT, and (b) arranged such that the flip-flop receives an INIT signal, an INITB signal, and an INITKEEP signal all indicated in FIG. 25. The description below deals with an all-ON operation for the case illustrated in FIGS. 24 and 25.

During an all-ON period, the INIT signal is active (High), the INITB signal is active (Low), and the INITKEEP signal is inactive (Low). This causes the bootstrap capacitor Cv to be discharged by the discharging section DC (because the transistor Tr4 is switched ON, and the transistors Tr1 and Tr8 are switched OFF), which in turn causes the first output section FO to be inactive and the second output section SO to be floating (because the transistors Tr5 and Tr9 are switched OFF). Thus, the first initialization section FT causes the source electrode (OUT terminal) of the transistor Tr1 of the first output section FO to be connected to the first power source VDD. This allows a VDD potential (High) to be reliably outputted to the OUT terminal regardless of the CK1 and CK2 signals, and causes an OUT terminal at another stage to be connected to the IN terminal. This causes the IN terminal to be active (High), which in turn switches the transistor Tr5 ON, thus switching the second output section SO OFF. On the other hand, until the GSP signal becomes active after the completion of the all-ON period, the INIT signal is inactive (Low), the INITB signal is inactive (High), and the INITKEEP signal is active (High). This switches the transistor Tr9 ON, and thus causes the second output section SO to be active (that is, switches the transistor Tr2 ON), which in turn allows a VSS potential (Low) to be reliably outputted to the OUT terminal regardless of the CK1 and CK2 signals.

The flip-flop of FIG. 14 is configured such that the third node Nc is connected to the first power source VDD via the resistor Rr and the transistor Tr6 in the reset circuit RS (Note that the transistor Tr6 is located on the side of the resistor Rr, while the transistor Tr6 is located on the side of the first power source VDD.). The flip-flop of FIG. 14 is, however, not limited to such a configuration, and may alternatively be configured as illustrated in FIG. 26 such that the third node Nc is connected to the first power source VDD via the transistor Tr6 and the resistor Rr (Note that the transistor Tr6 is located on the side of the third node, while the resistor Rr is located on the side of the first power source VDD.).

The flip-flop of FIG. 14 is configured such that the reset circuit RS includes a resistor Rr. The flip-flop of the present invention is, however, not limited to such a configuration, and may alternatively be configured as illustrated in FIG. 27 by replacing the resistor Rr with a diode-connected transistor TD.

The flip-flop of FIG. 14 may alternatively be configured as illustrated in FIG. 28 by removing only the malfunction preventing section from the configuration of FIG. 14. Further, the above flip-flop (for example, the flip-flop illustrated in FIG. 28) may be used to provide a bi-directionally shiftable shift register as illustrated in FIG. 29. The flip-flop, in this case, includes shift direction determining circuits SEL between adjacent stages, and involves a UD signal and a UDB signal each to be inputted to the shift direction determining circuits SEL. In the case of a forward direction (downward direction) shift, a shift direction determining circuit SEL2, for example, connects an OUT terminal of a flip-flop FF1 to an IN terminal of a flip-flop FF2. In the case of a reverse direction (upward direction) shift, a shift direction determining circuit SEL1, for example, connects an OUT terminal of the flip-flop FF2 to an IN terminal of the flip-flop FF1. The shift direction determining circuits SEL each include, as illustrated in FIG. 30, two N channel transistors, one of which has (i) a gate terminal connected to a UD terminal, (ii) a source electrode connected to an IX terminal, and (iii) a drain electrode connected to an O terminal, the other of which has (i) a gate terminal connected to a UDB terminal, (ii) a source electrode connected to an IY terminal, and (iii) a drain electrode connected to the O terminal.

As described above, a signal processing circuit of the present invention includes: a first input terminal; a second input terminal; an output terminal; a first output section including a bootstrap capacitor and connected to the second input terminal and the output terminal; a second output section connected to the first input terminal, a first power source (that is, a power source corresponding to a potential that causes the first input terminal to be inactive), and the output terminal; an electric charge control section for controlling an electric charge of the bootstrap capacitor, the electric charge control section being connected to the first input terminal; and a relay section by which the electric charge control section and the first output section are electrically (i) connected to each other or (ii) separated from each other, the electric charge control section including a resistor connected to a second power source (that is, a power source corresponding to a potential that causes the first input terminal to be active).

The above provision of the relay section allows the first output section to carry out a bootstrap operation, and also prevents a high potential caused by a bootstrap operation from being applied to the electric charge control section. This arrangement prevents a transistor of the electric charge control section from being deteriorated or destroyed, and can thus increases reliability. In addition, the use of a resistor (connected to the second power source) in the electric charge control section increases the degree of freedom in layout, and can thus reduce the circuit area.

The signal processing circuit of the present invention may be arranged such that the first output section includes a first transistor that has a first conductive electrode connected to the output terminal, a second conductive electrode connected to the second input terminal, and a control electrode connected to the first conductive electrode via the bootstrap capacitor; the second output section includes a second transistor that has a first conductive electrode connected to the first power source, a second conductive electrode connected to the output terminal, and a control electrode connected to the first input terminal; the electric charge control section includes a third transistor that has a first conductive electrode connected to the first power source, a second conductive electrode connected to the second power source via the resistor, and a control electrode connected to the first input terminal; and the relay section includes a fourth transistor that has a first conductive electrode connected to the control terminal of the first transistor, a second conductive electrode connected to the second conductive electrode of the third transistor, and a control electrode connected to the second power source.

The signal processing circuit of the present invention may be arranged such that the second input terminal receives a signal from the second power source.

The signal processing circuit of the present invention may be arranged such that the second input terminal receives a clock signal.

The signal processing circuit of the present invention may be arranged such that the first through fourth transistors are of an identical conductivity type.

The signal processing circuit of the present invention may be arranged such that the resistor is made of a material of which respective channels of the transistors are made.

The signal processing circuit of the present invention may further include: an inverting output terminal; a third output section (i) including another bootstrap capacitor different from the bootstrap capacitor and (ii) connected to the second power source and the inverting output terminal; and a fourth output section connected to the first power source and the inverting output terminal, wherein: said another bootstrap capacitor is charged via the first input terminal; and the fourth output section is connected to either the electric charge control section or the output terminal.

The signal processing circuit of the present invention may further include: an inverting output terminal; a third output section (i) including another bootstrap capacitor different from the bootstrap capacitor and (ii) connected to the second power source and the inverting output terminal; a fourth output section connected to the first power source and the inverting output terminal; and another electric charge control section different from the electric charge control section, wherein: said another bootstrap capacitor is charged from said another electric charge control section; and the fourth output section is connected to either the electric charge control section or the output terminal.

An inverter circuit of the present invention, a buffer circuit of the present invention, a level shifter circuit of the present invention, a flip-flop of the present invention, and a driver of the present invention each include the signal processing circuit.

The driver circuit of the present invention may further include: a shift register including flip-flops at respective stages, each flip-flop including: a first output section including a bootstrap capacitor and connected to a first clock signal terminal; a second output section connected to the first power source; a first input section for charging the bootstrap capacitor; a discharging section for discharging the bootstrap capacitor; a second input section connected to the second output section; and a resetting section for controlling the discharging section and the second output section, the resetting section being connected to a second clock signal terminal, wherein: a first initialization signal controls the first output section of each flip-flop; a second initialization signal controls the first input section of each flip-flop; a third initialization signal controls the discharging section and the second output section of each flip-flop; and the first initialization signal is inputted to the first input terminal of the signal processing circuit so that the second initialization signal is outputted from the output terminal of the signal processing circuit.

A display device of the present invention includes the signal processing circuit.

The present invention is not limited to the above embodiment, but further encompasses (i) embodiments achieved by appropriately modifying the above embodiment on the basis of known techniques and common general technical knowledge and (ii) embodiments achieved by combining such embodiments. Further, the operational advantages and the like described in the above embodiment are merely examples.

INDUSTRIAL APPLICABILITY

The flip-flop of the present invention is suitably used particularly in a driver circuit for a liquid crystal display device.

REFERENCE SIGNS LIST

INIT first initialization signal
INITB second initialization signal
INITKEEP third initialization signal
VDD high-level power source
VSS low-level power source
Tr21 through Tr24 first through fourth transistor

The invention claimed is:

1. A signal processing circuit comprising:
a first input terminal;
a second input terminal;
an output terminal;
a first output section including a bootstrap capacitor and connected to the second input terminal and the output terminal;
a second output section connected to the first input terminal, a first power source, and the output terminal;
an electric charge control section configured to control an electric charge of the bootstrap capacitor, the electric charge control section being connected to the first input terminal; and
a relay section including a relay transistor which includes: (i) a conductive electrode connected to the electric charge control section, (ii) another conductive electrode connected to the first output section, and (iii) a control electrode connected to a second power source; wherein
the electric charge control section includes a resistor connected to the second power source.

2. The signal processing circuit according to claim 1, wherein:
the second input terminal receives a signal from the second power source.

3. An inverter circuit comprising:
the signal processing circuit according to claim 1.

4. A buffer circuit comprising:
the signal processing circuit according to claim 1.

5. A level shifter comprising:
the signal processing circuit according to claim 1.

6. A flip-flop comprising:
the signal processing circuit according to claim 1.

7. A driver circuit comprising:
the signal processing circuit according to claim 1.

8. A display device comprising:
the signal processing circuit according to claim 1.

9. A signal processing circuit, comprising:
a first input terminal;
a second input terminal;
an output terminal;
a first output section including a bootstrap capacitor and connected to the second input terminal and the output terminal;
a second output section connected to the first input terminal, a first power source, and the output terminal;
an electric charge control section configured to control an electric charge of the bootstrap capacitor, the electric charge control section being connected to the first input terminal; and
a relay section by which the electric charge control section and the first output section are electrically (i) connected to each other or (ii) separated from each other; wherein:
the electric charge control section including a resistor connected to a second power source;
the first output section includes a first transistor that has a first conductive electrode connected to the output terminal, a second conductive electrode connected to the second input terminal, and a control electrode connected to the first conductive electrode via the bootstrap capacitor;
the second output section includes a second transistor that has a first conductive electrode connected to the first power source, a second conductive electrode connected to the output terminal, and a control electrode connected to the first input terminal;
the electric charge control section includes a third transistor that has a first conductive electrode connected to the first power source, a second conductive electrode connected to the second power source via the resistor, and a control electrode connected to the first input terminal; and
the relay section includes a fourth transistor that has a first conductive electrode connected to the control terminal of the first transistor, a second conductive electrode connected to the second conductive electrode of the third transistor, and a control electrode connected to the second power source.

10. The signal processing circuit according to claim 9, wherein:
the first through fourth transistors are of an identical conductivity type.

11. The signal processing circuit according to claim 9, wherein:
the resistor is made of a material of which respective channels of the transistors are made.

12. A signal processing circuit, comprising:
a first input terminal;
a second input terminal;
an output terminal;
a first output section including a bootstrap capacitor and connected to the second input terminal and the output terminal;
a second output section connected to the first input terminal, a first power source, and the output terminal;
an electric charge control section configured to control an electric charge of the bootstrap capacitor, the electric charge control section being connected to the first input terminal; and
a relay section by which the electric charge control section and the first output section are electrically (i) connected to each other or (ii) separated from each other; wherein:
the electric charge control section including a resistor connected to a second power source; and
the second input terminal receives a clock signal.

13. A signal processing circuit, further comprising:
a first input terminal,
a second input terminal;
an output terminal;
a first output section including a bootstrap capacitor and connected to the second input terminal and the output terminal;
a second output section connected to the first input terminal, a first power source, and the output terminal;
an electric charge control section configured to control an electric charge of the bootstrap capacitor, the electric charge control section being connected to the first input terminal; and
a relay section by which the electric charge control section and the first output section are electrically (i) connected to each other or (ii) separated from each other;
an inverting output terminal;
a third output section (i) including another bootstrap capacitor different from the bootstrap capacitor and (ii) connected to the second power source and the inverting output terminal; and
a fourth output section connected to the first power source and the inverting output terminal, wherein:
the electric charge control section including a resistor connected to a second power source;
said another bootstrap capacitor is charged via the first input terminal; and
the fourth output section is connected to either the electric charge control section or the output terminal.

14. A signal processing circuit comprising:
a first input terminal;
a second input terminals
an output terminal;
a first output section including a bootstrap capacitor and connected to the second input terminal and the output terminal;
a second output section connected to the first input terminal, a first power source, and the output terminal;
an electric charge control section configured to control an electric charge of the bootstrap capacitor, the electric charge control section being connected to the first input terminal; and
a relay section by which the electric charge control section and the first output section are electrically (i) connected to each other or (ii) separated from each other;
an inverting output terminal;
a third output section (i) including another bootstrap capacitor different from the bootstrap capacitor and (ii) connected to the second power source and the inverting output terminal;
a fourth output section connected to the first power source and the inverting output terminal; and
another electric charge control section different from the electric charge control section, wherein:
the electric charge control section including a resistor connected to a second power source;
said another bootstrap capacitor is charged from said another electric charge control section; and
the fourth output section is connected to either the electric charge control section or the output terminal.

15. A driver circuit, comprising:
a signal processing circuit including:
   a first input terminal;
   a second input terminal;
   an output terminal;
   a first output section including a bootstrap capacitor and connected to the second input terminal and the output terminal;
   a second output section connected to the first input terminal, a first power source, and the output terminal;
   an electric charge control section configured to control an electric charge of the bootstrap capacitor, the electric charge control section being connected to the first input terminal; and
   a relay section by which the electric charge control section and the first output section are electrically (i) connected to each other or (ii) separated from each other; wherein
   the electric charge control section including a resistor connected to a second power source;
a shift register including flip-flops at respective stages,
each flip-flop including:
   a first output section including a bootstrap capacitor and connected to a first clock signal terminal;
   a second output section connected to the first power source;
   a first input section for charging the bootstrap capacitor;
   a discharging section for discharging the bootstrap capacitor;
   a second input section connected to the second output section; and
   a resetting section for controlling the discharging section and the second output section, the resetting section being connected to a second clock signal terminal,
wherein:
a first initialization signal controls the first output section of each flip-flop; a second initialization signal controls the first input section of each flip-flop; a third initialization signal controls the discharging section and the second output section of each flip-flop; and the first initialization signal is inputted to the first input terminal of the signal processing circuit so that the second initialization signal is outputted from the output terminal of the signal processing circuit.

* * * * *